(12) United States Patent
Quiquempoix et al.

(10) Patent No.: US 7,994,958 B2
(45) Date of Patent: Aug. 9, 2011

(54) MULTI-LEVEL FEED-BACK DIGITAL-TO-ANALOG CONVERTER USING A CHOPPER VOLTAGE REFERENCE FOR A SWITCHED CAPACITOR SIGMA-DELTA ANALOG-TO-DIGITAL CONVERTER

(75) Inventors: Vincent Quiquempoix, Divonne les Bains (FR); Philippe Deval, Lutry (CH)

(73) Assignee: Microchip Technology Incorporated, Chandler, AZ (US)

( * ) Notice: Subject to any disclaimer, the term of this patent is extended or adjusted under 35 U.S.C. 154(b) by 37 days.

(21) Appl. No.: 12/581,982

(22) Filed: Oct. 20, 2009

(65) Prior Publication Data

US 2010/0103014 A1    Apr. 29, 2010

Related U.S. Application Data

(60) Provisional application No. 61/107,824, filed on Oct. 23, 2008.

(51) Int. Cl.
*H03M 1/66* (2006.01)
*H03M 3/00* (2006.01)
(52) U.S. Cl. .................. 341/150; 341/143; 341/144
(58) Field of Classification Search .......... 341/143–144, 341/150
See application file for complete search history.

(56) References Cited

U.S. PATENT DOCUMENTS

| 6,462,612 B1 | 10/2002 | Roh et al. ............... 327/539 |
| 6,909,388 B1 | 6/2005 | Quiquempoix et al. ...... 341/143 |
| 7,102,558 B2 * | 9/2006 | Deval ..................... 341/150 |
| 2004/0141562 A1 | 7/2004 | Plisch et al. ............. 375/259 |

FOREIGN PATENT DOCUMENTS

| WO | 2005/0117269 A1 | 12/2005 |
| WO | 2006/0023355 A1 | 3/2006 |
| WO | 2008/0014246 A1 | 1/2008 |
| WO | WO 2008/014246 * | 1/2008 |

OTHER PUBLICATIONS

International PCT Search Report and Written Opinion, PCT/US2009/061617, 14 pages, Mailed May 25, 2010.

* cited by examiner

*Primary Examiner* — Khai M Nguyen
(74) *Attorney, Agent, or Firm* — King & Spalding L.L.P.

(57) ABSTRACT

A multi-bit digital-to-analog converter has a reference voltage generator generating a reference voltage with an offset voltage; a switched capacitor stage for generating a plurality of output voltages; and a switching sequencer controlling the switched capacitor stage operable to generate switching patterns for each output voltages, wherein each pattern has a charge phase and a transfer phase, and wherein for at least one output voltage the switching sequencer provides two switching patterns wherein each switching pattern contributes an offset of opposite polarity.

33 Claims, 17 Drawing Sheets

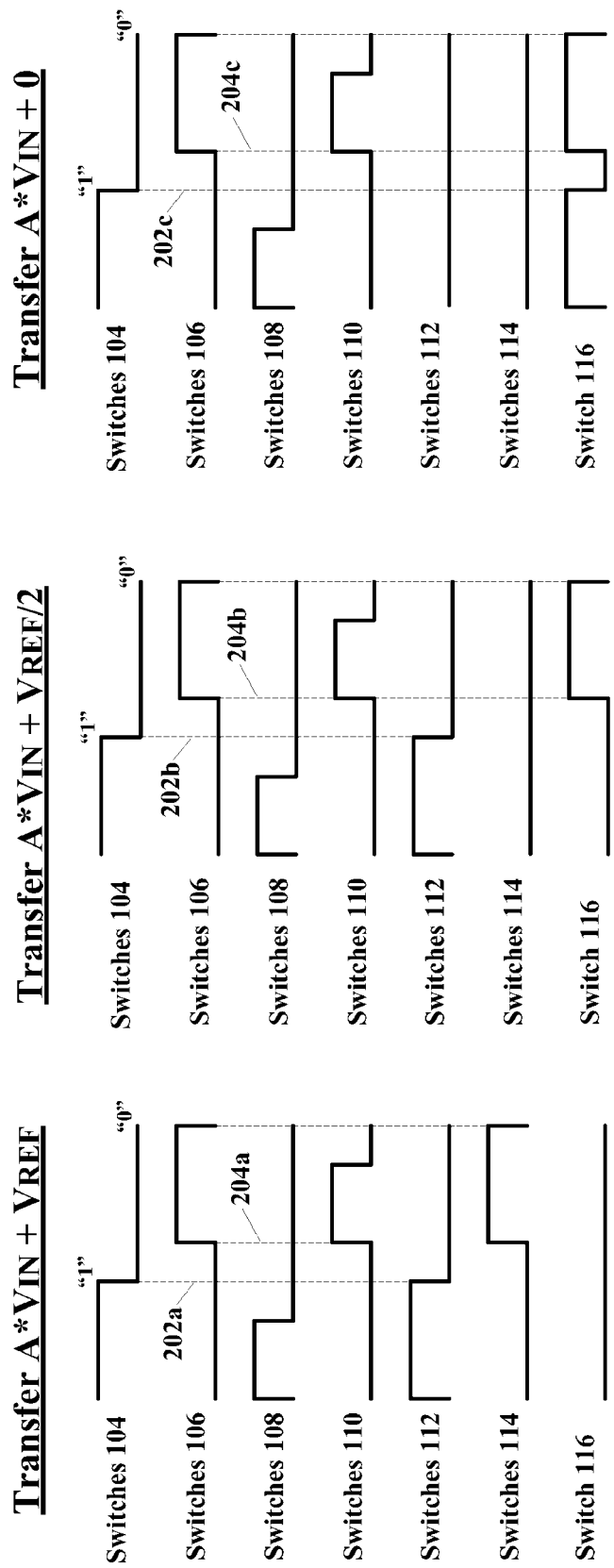

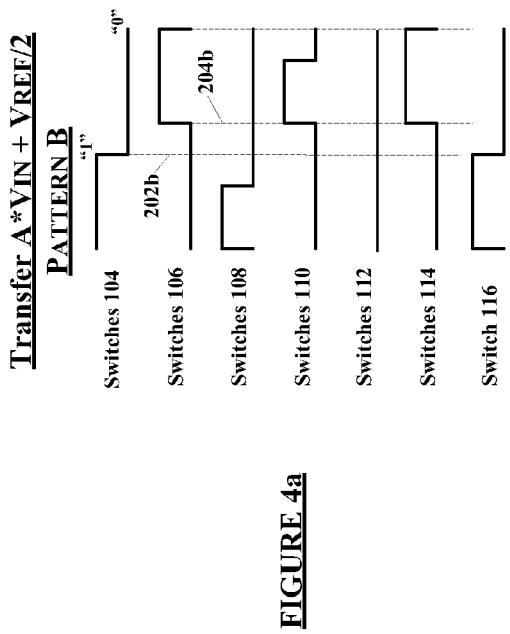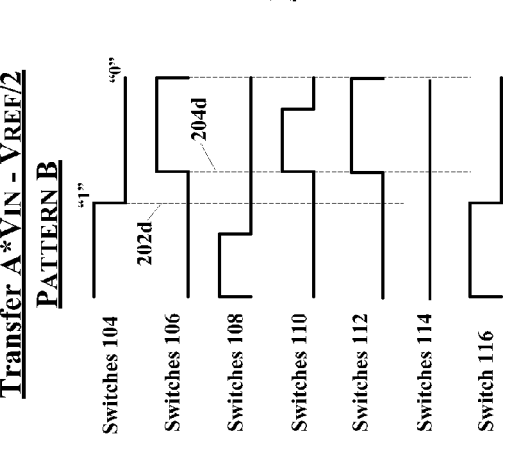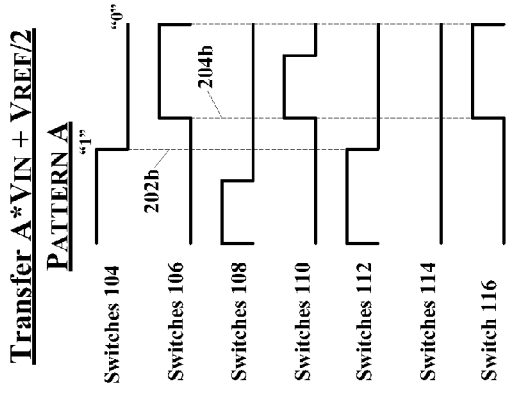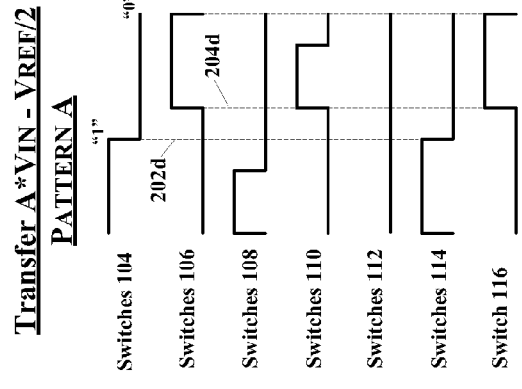

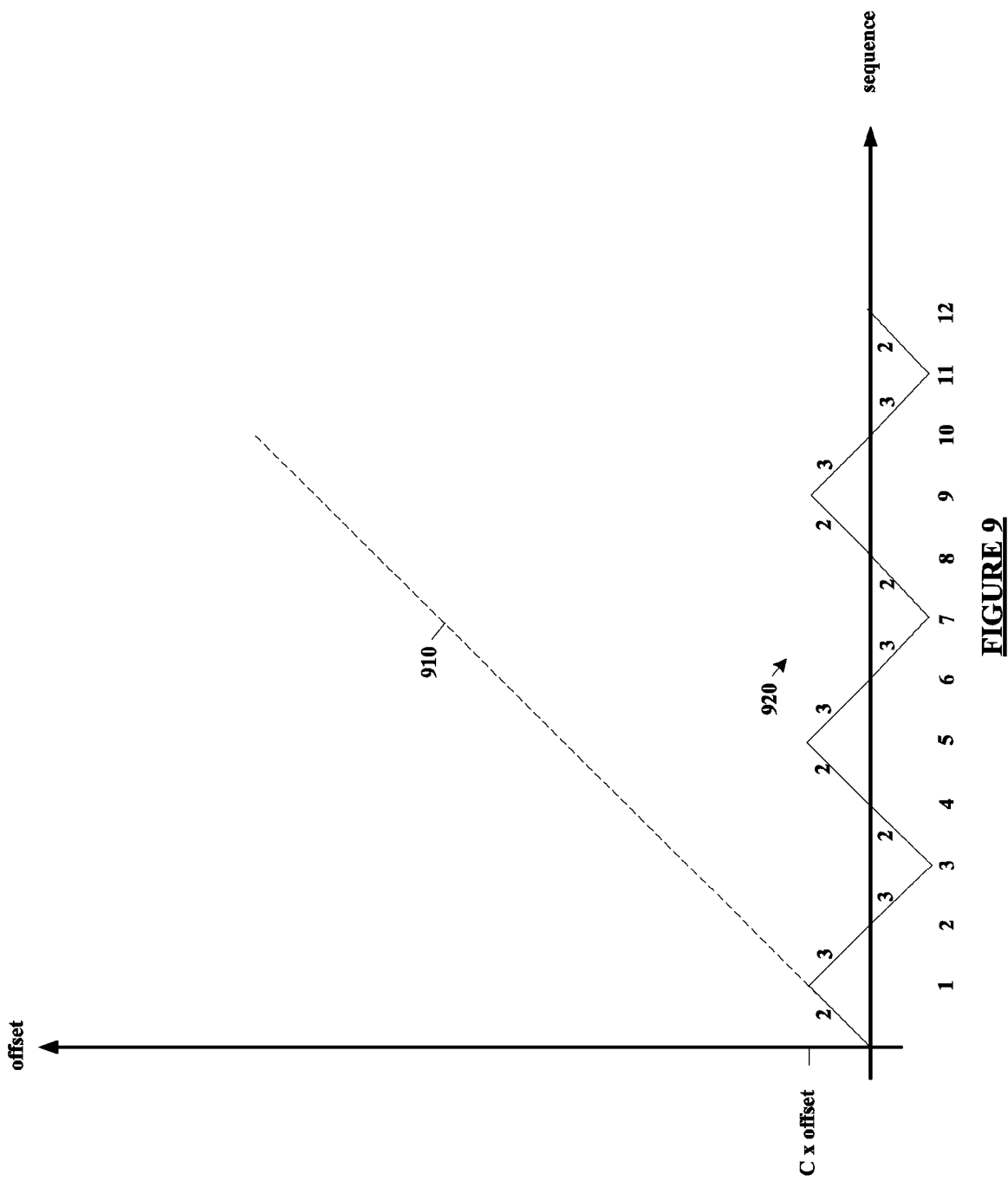

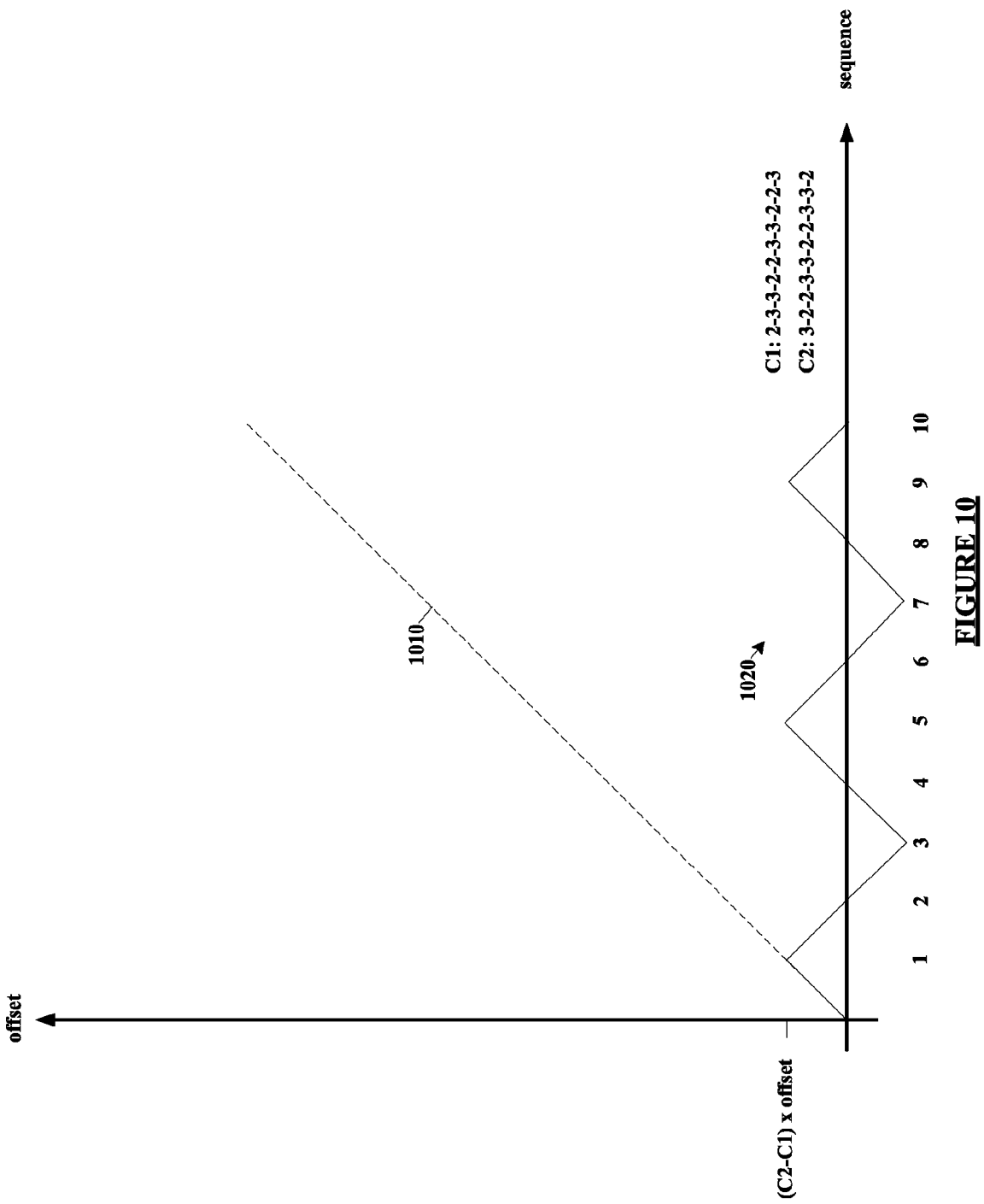

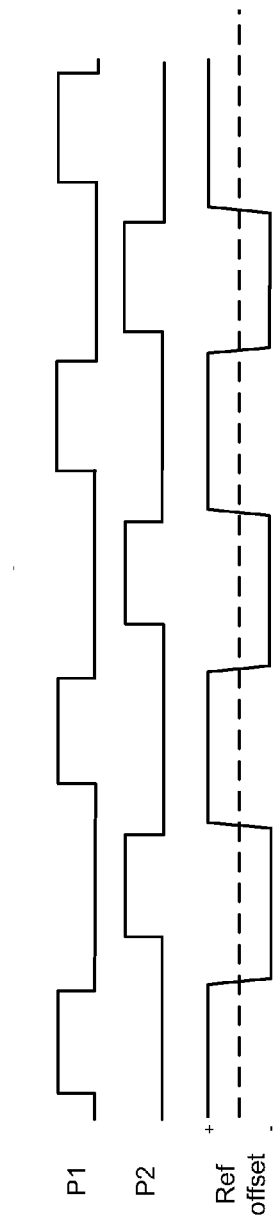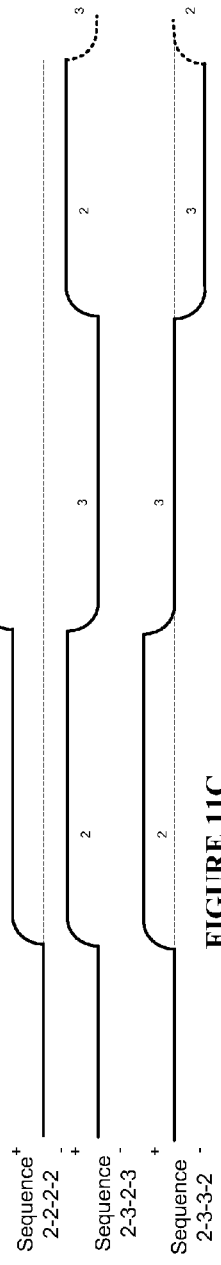
FIGURE 11C
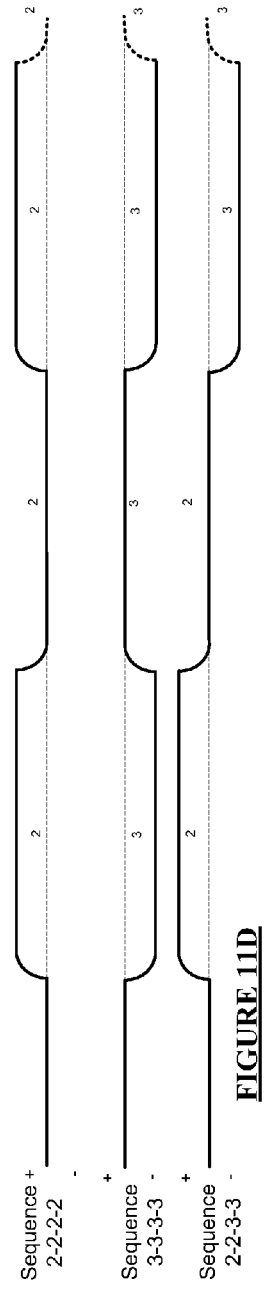
FIGURE 11D

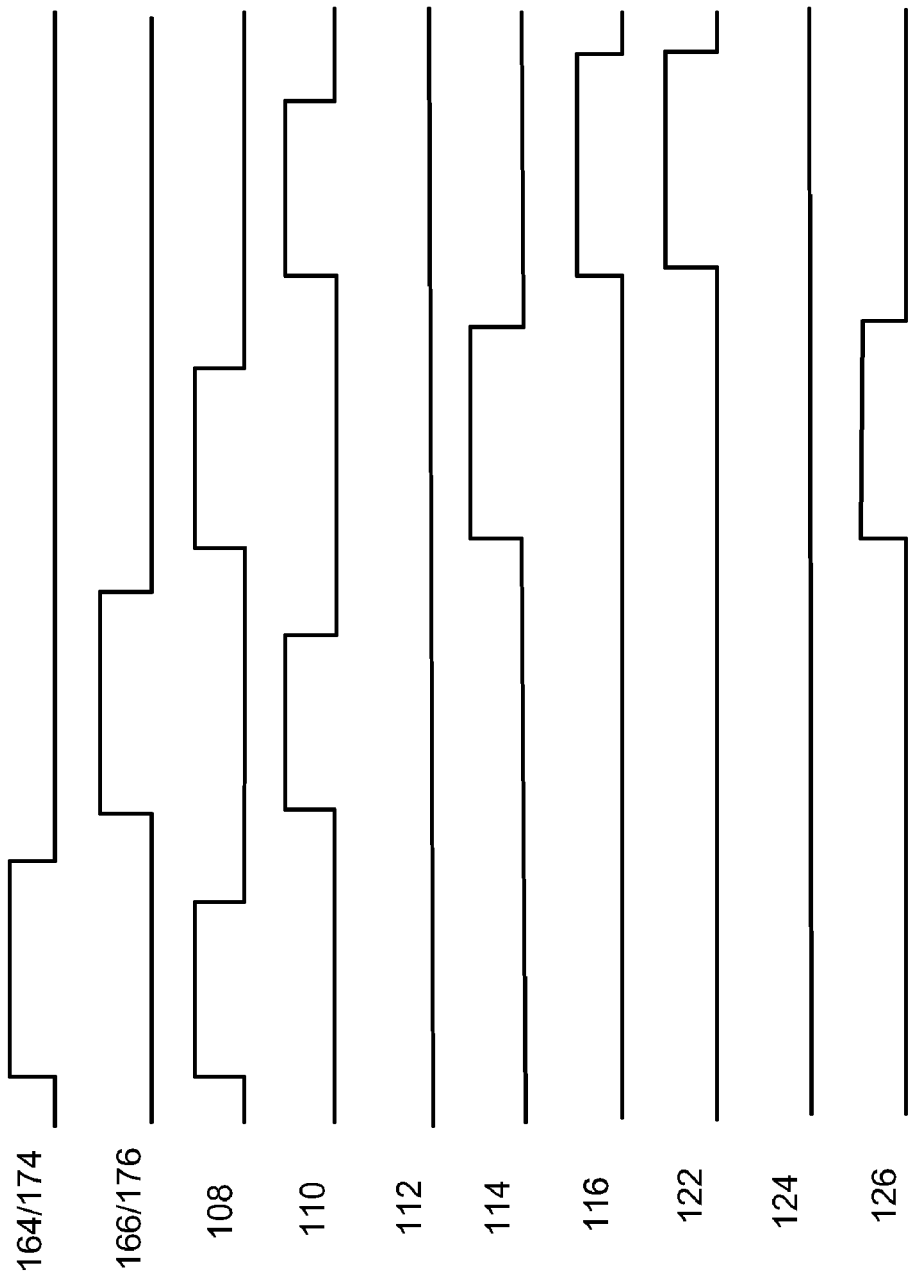

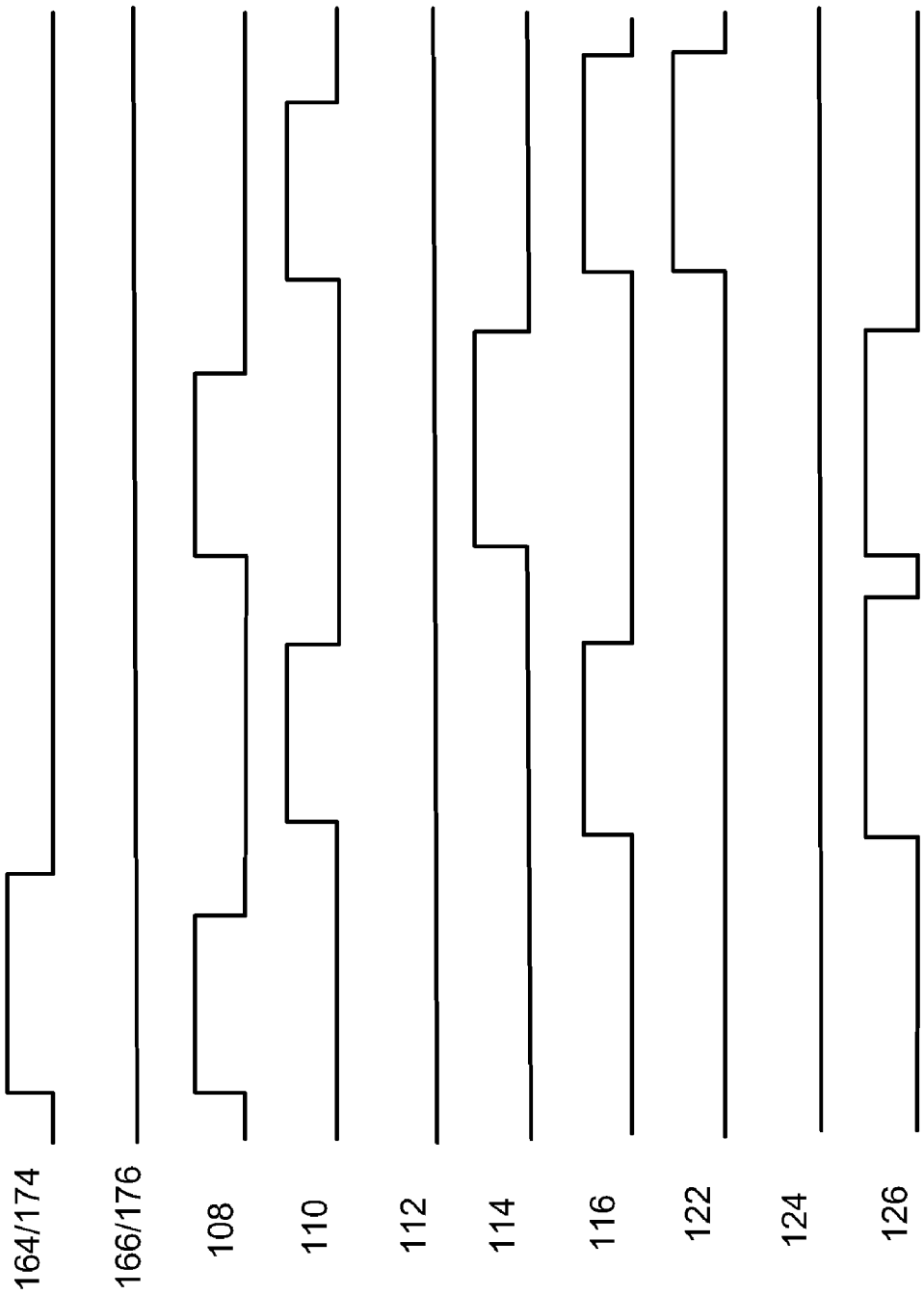

MULTI-LEVEL FEED-BACK DIGITAL-TO-ANALOG CONVERTER USING A CHOPPER VOLTAGE REFERENCE FOR A SWITCHED CAPACITOR SIGMA-DELTA ANALOG-TO-DIGITAL CONVERTER

CROSS-REFERENCE TO RELATED APPLICATIONS

This application claims the benefit of U.S. Provisional Application No. 61/107,824 filed on Oct. 23, 2008 entitled "FIVE-LEVEL FEED-BACK DIGITAL-TO-ANALOG CONVERTER USING A CHOPPER VOLTAGE REFERENCE FOR A SWITCHED CAPACITOR SIGMA-DELTA ANALOG-TO-DIGITAL CONVERTER", which is incorporated herein in its entirety.

TECHNICAL FIELD

The present disclosure relates to analog-to-digital converters (ADCs) and, more particularly, to a way of reducing 1/f noise and direct current (DC) offset from a voltage reference source associated with the analog-to-digital converter.

BACKGROUND

Analog-to-digital converters (ADCs) are in widespread use today in electronic applications for consumer, medical, industrial, etc. Typically, ADCs include circuitry for receiving an analog input signal and outputting a digital value proportional to the analog input signal. This digital output value is typically in the form of either a parallel word or a serial digital bit string. There are many types of analog-to-digital conversion schemes such as voltage-to-frequency conversion, charge redistribution, delta modulation, as well as others. Typically, each of these conversion schemes has its advantages and disadvantages.

One type of analog-to-digital converter (ADC) that has seen increasing use is the switched capacitor sigma-delta ADC (sigma-delta and delta-sigma will be used interchangeably herein). The sigma-delta ADC utilizes delta-sigma modulation where an analog voltage is input to the delta-sigma modulator and the output thereof is filtered to remove noise. A delta-sigma modulator typically converts an analog input to a digital serial string of "ones" and "zeros" having an average amplitude over time proportional to the analog input. Delta-sigma modulation generally provides for high accuracy and wide dynamic range as compared to earlier delta modulation techniques. Delta-sigma modulation is often referred to as an oversampled converter architecture and is typically immune from some of the earlier undesirable second order effects of delta modulation.

The switched capacitor sigma-delta converter uses a digital-to-analog converter (DAC) in a feedback loop that applies a voltage(s) to an analog summing node located at the front end (analog portion) of the delta-sigma modulator. With any ADC there are a number of noise sources that are inherent in the ADC design. In a typical delta-sigma ADC, there are typically three types of noise: the quantization noise coming from the error introduced by the quantizer in the feedback loop, the thermal noise coming from the devices of the converter itself and the 1/f noise coming also from the devices. In addition, since the output code of the ADC is proportional to the ratio of the input voltage and the reference voltage, any additional noise coming from the reference voltage will be present at the output especially when the ratio of the input voltage over reference voltage is close to 1. Moreover, a deterministic error in the voltage reference coming from a DC offset will impact the ADC as a gain error.

The quantization noise at low frequencies is relatively low with the largest portion thereof existing at higher frequencies. This higher frequency portion noise can be filtered out by a digital domain filter, e.g., decimation and/or digital low-pass filter. Moreover, the quantization noise can be lowered by increasing either the order of the modulator or the resolution of the DAC. The thermal noise coming from both the reference voltage and the ADC can be averaged by increasing the oversampling ratio of the converter. However, averaging techniques do not filter DC offset and 1/f noise, especially when they come from the voltage reference, as they are typically passed through the converter with the signal information. For high-resolution ADCs, 1/f noise becomes the dominant one when both quantization and thermal noise have been reduced. It is very difficult to attenuate since it is not affected by increasing complexity of the ADC (higher order, multi-bit DAC) or the oversampling.

DC offset from the voltage reference may be substantially reduced by using a chopper stabilized voltage reference. A typical chopper stabilized bandgap voltage reference is more fully described in U.S. Pat. No. 6,462,612, entitled "Chopper Stabilized Bandgap Reference Circuit to Cancel Offset Variation" by Roh et al., and is incorporated by reference herein for all purposes. The chopper stabilized voltage reference substantially reduces direct current (DC) offset voltage error in the voltage reference. However, the typical chopper stabilized voltage reference requires an analog low-pass filter at the output of the reference to remove the components of the high-frequency modulation introduced by the chopper stabilization. Such a low pass filter isn't required when the chopped Bandgap voltage is directly applied to the reference input of a sigma-delta converter: the HF chopping noise can be filtered out by the decimation and/or digital low-pass filter. However, a modified chopper sequence is required when the decimation and/or digital low-pass filter is used for filtering out HF chopping noise. FIG. 12 shows the errors produced by a 5-level DAC with conventional chopper algorithm. As can be seen, huge spikes appear when the bit stream and chopper control frequency correlation is high.

A sigma-delta analog-to-digital converter (ADC) may use a multibit DAC in the modulator loop. This has advantages in terms of resolution, signal to noise ratio and brings improvements regarding stability at a reduced cost in terms of design complexity and power consumption. However, linearity is often degraded by a multi-bit DAC that is not inherently linear and often requires very accurate calibration and/or trimming.

On the other hand, the voltage references used by the ADC often contribute significantly to the noise figure of the system, especially on low bandwidth systems because of the 1/f noise that is not removed with oversampling technique. Moreover, the offset of the amplifier in the voltage reference circuit contributes to gain error of the ADC and often requires trimming or calibration.

SUMMARY

What is needed is a multi-level, e.g., five-level, digital-to-analog converter (DAC) that provides inherent linearity and voltage reference offset cancellation, and 1/f noise reduction.

According to an embodiment, a multi-bit digital-to-analog converter may comprise a chopped reference voltage generator for generating a reference voltage that comprises a chopped offset voltage; a switched capacitor stage for generating a plurality of output voltages; and a switching sequencer controlling the switched capacitor stage operable to generate switching patterns for each output voltages, wherein each pattern comprising a charge phase and a transfer phase, and wherein for at least one output voltage the switching sequencer provides two switching patterns wherein each switching pattern contributes an offset of opposite polarity.

According to a further embodiment, the switching sequencer may comprise memory means to store the sign of a generated offset and the switching sequencer selects a pattern depending on an input value and said stored sign. According to a further embodiment, the reference voltage generator can be chopped with each charge and transfer phase and the two switching patterns can be applied alternately to the switched capacitor stage. According to a further embodiment, the reference voltage generator can be chopped only between a charge and a transfer phase and either the first or second switching patterns is applied to the switched capacitor stage. According to a further embodiment, the switched capacitor stage may comprise two partial switching stages in parallel and the two switching patterns are applied to the first and second partial switching stages, respectively. According to a further embodiment, the two switching patterns can be applied alternately to the first and second partial switching stages. According to a further embodiment, the switched capacitor stage may comprise a plus reference voltage capacitor having a capacitance of C; a minus reference voltage capacitor having a capacitance of C; a first pair of switches adapted for switchably coupling the plus and minus reference voltage capacitors to plus and minus reference voltages, respectively; a second pair of switches adapted for switchably coupling the plus and minus reference voltage capacitors to the minus and the plus reference voltages, respectively; and a third switch adapted for switchably coupling the plus and minus reference voltage capacitors together. According to a further embodiment, the multi-bit digital-to-analog converter may be a 5-level (3-bit) digital-to-analog converter and wherein the first pair of switches, the second pair of switches, and the third switch are sequenced in a charge phase and a transfer phase to produce five equally distributed charge levels of $2C*V_{REF}$, $C*V_{REF}$, 0, $-C*V_{REF}$ and $-2C*V_{REF}$, wherein $V_{REF}$ is a reference voltage. According to a further embodiment, the charge phase and transfer phase switching sequences of the first pair of switches, the second pair of switches, and the third switch do not overlap. According to a further embodiment, for the charge level of $C*V_{REF}$, in a first pattern: the first pair of switches are closed during the charge phase and open during the transfer phase; the second pair of switches are open during the charge phase and the transfer phase; and the third switch is open during the charge phase and closed during the transfer phase; and in a second pattern: the first pair of switches are open during the charge phase and during the transfer phase; the second pair of switches are open during the charge phase and closed during the transfer phase; and the third switch is closed during the charge phase and open during the transfer phase. According to a further embodiment, for the charge level of $-C*V_{REF}$, in a first pattern: the first pair of switches are open during the charge phase and the transfer phase; the second pair of switches are closed during the charge phase and open during the transfer phase; and the third switch is open during the charge phase and closed during the transfer phase; and in a second pattern: the first pair of switches are open during the charge phase and closed during the transfer phase; the second pair of switches are open during the charge phase and the transfer phase; and the third switch is closed during the charge phase and open during the transfer phase. According to a further embodiment, the switched capacitor stage may comprise first and second reference voltage switching circuits, each comprising: a plus reference voltage capacitor having a capacitance of C/2; a minus reference voltage capacitor having a capacitance of C/2; a first pair of switches adapted for switchably coupling the plus and minus reference voltage capacitors to plus and minus reference voltages, respectively; a second pair of switches adapted for switchably coupling the plus and minus reference voltage capacitors to the minus and the plus reference voltages, respectively; and a third switch adapted for switchably coupling the plus and minus reference voltage capacitors together, wherein the first pair of switches, the second pair of switches. According to a further embodiment, the multi-bit digital-to-analog converter may be a 5-level (3-bit) digital-to-analog converter and wherein the first pair of switches, the second pair of switches, and the third switch of each reference voltage switching circuit are sequenced in a charge phase and a transfer phase to produce five equally distributed charge levels of $C*V_{REF}$, $C/2*V_{REF}$, 0, $-C/2*V_{REF}$ and $-C*V_{REF}$, wherein $V_{REF}$ is a reference voltage. According to a further embodiment, the charge phase and transfer phase switching sequences of the first pair of switches, the second pair of switches, and the third switch for each reference voltage switching circuit do not overlap. According to a further embodiment, for the charge level of $C/2*V_{REF}$, for the first reference voltage switching circuit: the first pair of switches are closed during the charge phase and open during the transfer phase; the second pair of switches are open during the charge phase and the transfer phase; and the third switch is open during the charge phase and closed during the transfer phase; and for the second reference voltage switching circuit: the first pair of switches are open during the charge phase and during the transfer phase; the second pair of switches are open during the charge phase and closed during the transfer phase; and the third switch is closed during the charge phase and open during the transfer phase; or vice versa. According to a further embodiment, for the charge level of $-C/2*V_{REF}$, for the first reference voltage switching circuit: the first pair of switches are open during the charge phase and the transfer phase; the second pair of switches are closed during the charge phase and open during the transfer phase; and the third switch is open during the charge phase and closed during the transfer phase; and for the second reference voltage switching circuit: the first pair of switches are open during the charge phase and closed during the transfer phase; the second pair of switches are open during the charge phase and the transfer phase; and the third switch is closed during the charge phase and open during the transfer phase; or vice versa. According to a further embodiment, a sigma-delta modulator may comprise such a multi-bit digital-to-analog converter, and may further comprise an analog input voltage stage with a capacitive feedback network coupled with said multi-bit digital-to-analog converter.

According to another embodiment, a method for producing at least one output voltage of a plurality of output voltages in a switched capacitor digital-to-analog converter, may comprise the steps of: receiving an input signal for the at least one output voltage; providing a reference voltage using chopper control, thereby generating a positive or negative offset to said reference voltage, generating said at least one output voltage with a first switching pattern A having a first and second phase, thereby generating a positive offset; and generating said at least one output voltage with a second switching pattern B different from said first switching pattern for said first and second phase, thereby generating a negative offset.

According to a further embodiment, the method may further comprise the steps of storing the sign of a generated offset, and selecting a pattern depending on the input signal and said stored sign. According to a further embodiment, the chopper control may chop the reference voltage for each first and second phase. According to a further embodiment, the chopper control may chop the reference voltage only between said first and second phase and only pattern A or pattern B is used. According to a further embodiment, the first pattern and second pattern can be used alternately in for a sequence of the input signals with a control sequence of "ABABAB . . . " or "BABABA . . . ". According to a further embodiment, the first pattern and second pattern can be used alternately in for a sequence of the input signals including a control sequence of "AABBAABB . . . " or "BBAABBAA . . . ". According to a further embodiment, five reference voltage levels can be generated in a feed-back digital-to-analog converter, the method comprising the steps of: providing a plus reference voltage capacitor having a capacitance of C; providing a minus reference voltage capacitor having a capacitance of C; producing a charge level of $C*V_{REF}$ by coupling the plus and minus reference voltage capacitors to the plus and minus reference voltages, respectively, during the charge phase, and coupling the plus and minus reference voltage capacitors together, during the transfer phase; or by coupling the plus and minus reference voltage capacitors together, during the charge phase; and coupling the plus and minus reference voltage capacitors to the minus and plus reference voltages, respectively, during the transfer phase; and producing a charge level of $-C*V_{REF}$ by coupling the plus and minus reference voltage capacitors to the minus and the plus reference voltages, respectively, during the charge phase; and coupling the plus and minus reference voltage capacitors together, during the transfer phase; or by coupling the plus and minus reference voltage capacitors together, during the charge phase; and coupling the plus and minus reference voltage capacitors to the plus and the minus reference voltages, respectively, during the transfer phase. According to a further embodiment, the method as described above may further comprise the steps of: providing a plus input voltage capacitor having a capacitance of $A*C$; providing a minus input voltage capacitor having a capacitance of $A*C$; coupling the plus and minus input voltage capacitors to plus and minus input voltages, respectively, during the charge phase; coupling the plus and minus input voltage capacitors to the minus and plus input voltages, respectively, during the transfer phase; coupling the plus and minus reference voltage capacitors and the plus and minus input voltage capacitors to a common mode voltage during the charge phase; and coupling the plus and minus reference voltage capacitors and the plus and minus input voltage capacitors to a differential input of an amplifier during the transfer phase, wherein the amplifier having a respective capacitive feedback network produces five equally distributed output voltages of $A*V_{IN}+V_{REF}$, $A*V_{IN}+V_{REF}/2$, $A*V_{IN}+0$, $A*V_{IN}-V_{REF}/2$ and $A*V_{IN}-V_{REF}$, where A is gain, $V_{IN}$ is the input voltage, and $V_{REF}$ is the reference voltage.

According to yet another embodiment, a method for producing at least one output voltage of a plurality of output voltages in a switched capacitor digital-to-analog converter, may comprise the steps of: receiving an input signal for the at least one output voltage; providing a reference voltage using chopper control, thereby generating a positive or negative offset to said reference voltage, generating a first partial charge with a first switching pattern A using a first and second phase, thereby generating a positive offset; and in parallel generating a second partial charge with a second switching pattern B different from the first switching pattern using the first and second phase, thereby generating a negative offset; adding the first and second partial charges to form the output voltage.

According to a further embodiment, the method may further comprise the steps of storing the sign of a resulting offset, and selecting first and second patterns depending on the input signal and said stored sign. According to a further embodiment, the switching pattern for the first partial charge and the second partial charge can be alternated for a sequence of the input signals, wherein an alternating control sequence comprises the patterns "ABABAB . . . " or "BABABA . . . ". According to a further embodiment, the switching pattern for the first partial charge and the second partial charge can be alternated for a sequence of the input signals, wherein an alternating control sequence comprises the patterns "AABBAABB . . . " or "BBAABBAA . . . ". According to a further embodiment, five reference voltage levels can be generated in a feed-back digital-to-analog converter, the method comprising the steps of: providing a first plus reference voltage capacitor having a capacitance of $C/2$; providing a first minus reference voltage capacitor having a capacitance of $C/2$; providing a second plus reference voltage capacitor having a capacitance of $C/2$; providing a second minus reference voltage capacitor having a capacitance of $C/2$; producing a charge level of $C*V_{REF}$ by generating a first charge by: coupling the first plus and minus reference voltage capacitors to the plus and minus reference voltages, respectively, during the charge phase, and coupling the first plus and minus reference voltage capacitors together, during the transfer phase; generating a second charge by: coupling the second plus and minus reference voltage capacitors together, during the charge phase; and coupling the second plus and minus reference voltage capacitors to the minus and plus reference voltages, respectively, during the transfer phase; and adding the first and second charge; and producing a charge level of $-C*V_{REF}$ by generating a first charge by: coupling the first plus and minus reference voltage capacitors to the minus and the plus reference voltages, respectively, during the charge phase; and coupling the first plus and minus reference voltage capacitors together, during the transfer phase; generating a second charge by: coupling the second plus and minus reference voltage capacitors together, during the charge phase; and coupling the second plus and minus reference voltage capacitors to the plus and the minus reference voltages, respectively, during the transfer phase; and adding the first and second charge. According to a further embodiment, the above method may further comprise the steps of: providing a plus input voltage capacitor having a capacitance of $A*C$; providing a minus input voltage capacitor having a capacitance of $A*C$; coupling the plus and minus input voltage capacitors to plus and minus input voltages, respectively, during the charge phase; coupling the plus and minus input voltage capacitors to the minus and plus input voltages, respectively, during the transfer phase; coupling the plus and minus reference voltage capacitors and the plus and minus input voltage capacitors to a common mode voltage during the charge phase; and coupling the plus and minus reference voltage capacitors and the plus and minus input voltage capacitors to a differential input of an amplifier during the transfer phase, wherein the amplifier having a respective capacitive feedback network produces five equally distributed output voltages of $A*V_{IN}+V_{REF}$, $A*V_{IN}+V_{REF}/2$, $A*V_{IN}+0$, $A*V_{IN}-V_{REF}/2$ and $A*V_{IN}-V_{REF}$, where A is gain, $V_{IN}$ is the input voltage, and $V_{REF}$ is the reference voltage. According to a further embodiment, the method may comprising the steps of: providing first and second analog input circuits for directly coupling an analog input signal with first plus and minus reference voltage capacitors of a first partial reference circuit and second plus and minus reference voltage capacitors of a second partial reference circuit; coupling the first and second plus and minus reference voltage capacitors with said analog input signal, respectively, during a first charge phase; coupling the first and second plus and minus reference voltage capacitors with an inverted analog input signal, respectively, during a first transfer phase; coupling the first plus and minus reference voltage capacitors with an inverted reference voltage while connecting said second plus and minus reference voltage capacitors during a second charge phase; and coupling the second plus and minus reference voltage capacitors with the reference voltage while connecting said first plus and minus reference voltage capacitors during a second transfer phase.

BRIEF DESCRIPTION OF THE DRAWINGS

FIGS. 3a-e show different patterns generating output voltages of the five level digital-to-analog converter shown in FIG. 2;

FIGS. 4a-b show patterns for input values generating +Vref*C;

FIGS. 5a-b show patterns for input values generating −Vref*C;

FIG. 9 shows offset contribution using a second switching algorithm;

FIG. 10 shows offset contributions using a third switching algorithm.

FIG. 11A-D shows results of using a chopped reference voltage depending on synchronization with the charge-transfer phases.

FIG. 14 shows first exemplary switching patterns for the embodiment shown in FIG. 13; and FIG. 15 shows second exemplary switching patterns for the embodiment shown in FIG. 13.

DETAILED DESCRIPTION

According to the teachings of this disclosure, combining an inherently linear multi-level, e.g., five-level, switched capacitor multi-bit DAC and a chopper stabilized voltage reference allows improvement of both signal to noise ratio and resolution, as well as 1/f noise cancellation, and gain error reduction with no calibration required. This new novel and non-obvious combination uses switching techniques that do not require any modification of the voltage reference technique to perform the chopper algorithm or any bitstream modulation. The same voltage reference can then be reused on other ADCs connected in parallel for multi-channel systems for better matching between channels.

A five-level feed-back DAC for a switched capacitor Sigma-Delta ADC is more fully described in commonly owned U.S. Pat. No. 7,102,558 B2; entitled "Five-Level Feed-Back Digital-to-Analog Converter for a Switched Capacitor Sigma-Delta Analog-to-Digital Converter" by Philippe Deval, and is incorporated by reference herein for all purposes.

Figure 1:
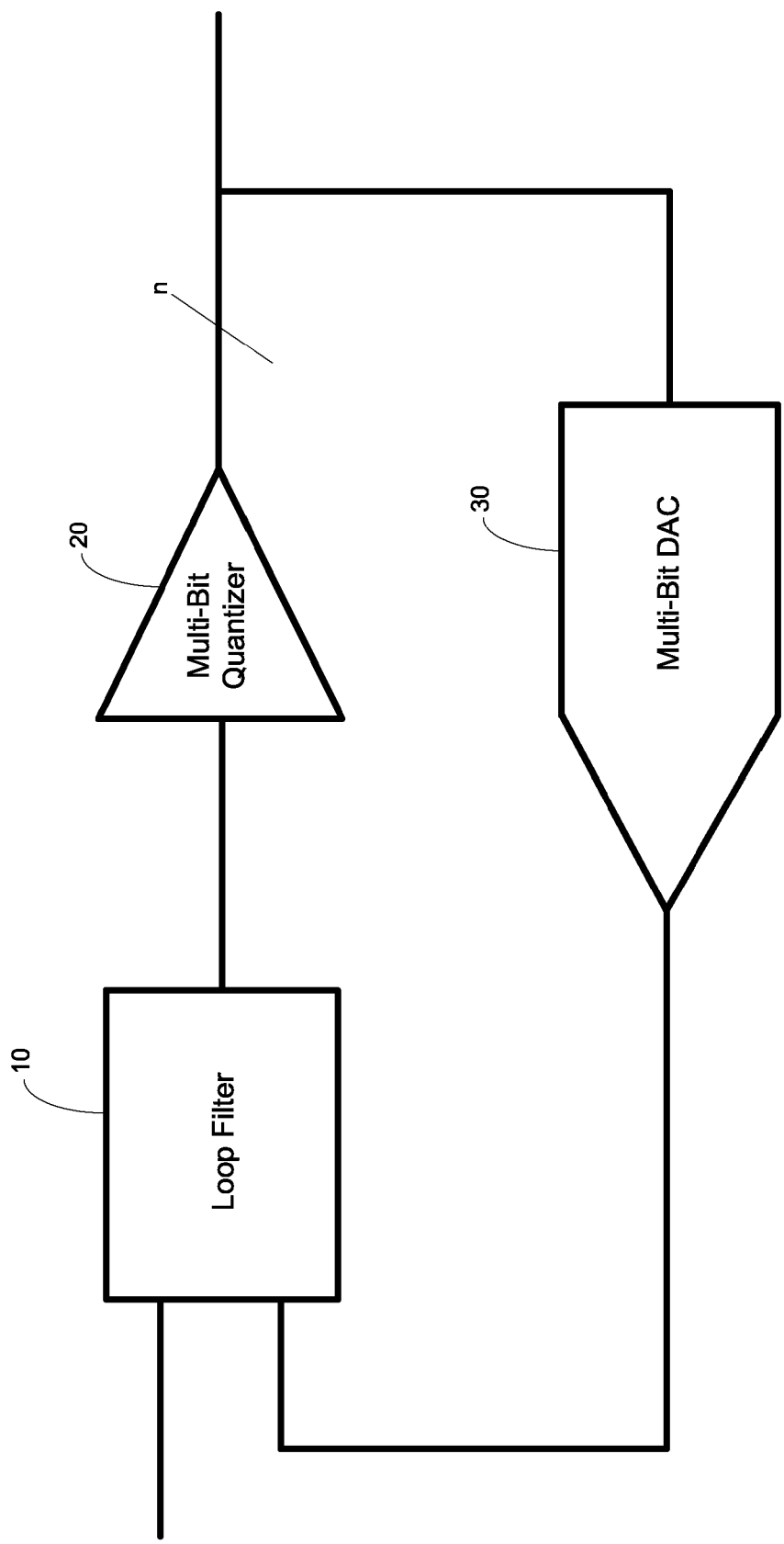
FIG. 1 shows a block diagram of a sigma-delta analog-to-digital converter.

FIG. 1 shows the principle block diagram of a multi-level sigma-delta ADC. A loop filter 10 receives the analog input value and is connected to a multi-bit quantizer 20 operable to generate multiple distinct output levels that can be encoded in a n-bits bit steam. This n bits bit stream is fed back to a multi-bit DAC 30 which generates an output signal that is fed to the loop filter 10. This n bits bit stream can be further processed, for example, in a digital domain filter.

Figure 2:
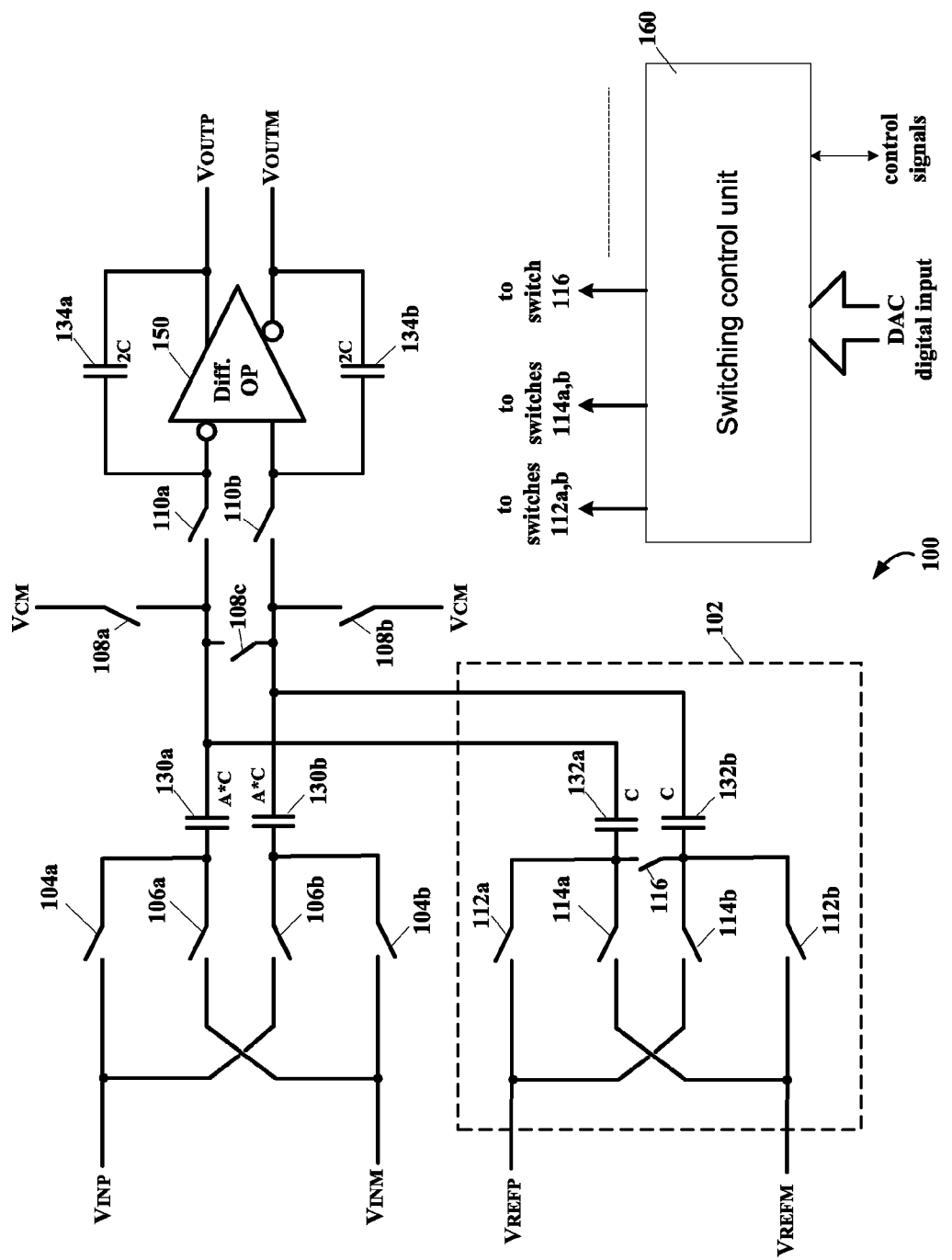
FIG. 2 shows an embodiment of a five level digital-to-analog converter using a chopper voltage reference for a switched capacitor sigma-delta analog to digital converter.

Referring to FIG. 2, depicted is a schematic circuit diagram of capacitor switching arrays and a differential amplifier for use in a multi-bit digital-to-analog converter (DAC), which can be used according to specific exemplary embodiments of the invention. In this specific example, a five level feed-back DAC is shown. The five-level feed-back DAC, generally represented by the numeral 100, can be operated using switching patterns that generates five equally spaced charge quantities during two phases, such as a charge or pre-charge phase and a transfer phase, of a differential charge transfer. Thus, a pattern is defined by two phases according to an embodiment. However, other patterns with more phase may be used. In summary, a pattern is to be understood to generate an output voltage of the DAC. In the following description, a sequence of patterns may be used which refers to a sequence of output voltages in the time domain generated by the DAC.

The five equally distributed charge levels in this five level embodiment may be 2C*Vref, C*Vref, 0, −C*Vref and −2C*Vref. Other embodiments may have more or less levels and may use different values for the reference voltage. As mentioned above, each voltage is generated by a switching pattern which, for example, can be generated by a switching control unit 160. Switching control unit 160 receives the DAC digital input word or the multi-level input information which is used to decode or determine which pattern is applied to the switches. FIG. 2 only shows control lines for the switches in the reference voltage switching circuit. However, as indicated by the dotted line switching control unit 160 may generate all necessary switch control signals for the remaining switches of the circuit shown in FIG. 2. As further indicated in FIG. 2, switching control unit 160 may also receive and generate further control signals such as clock signals, conversion start signals, conversion end signals, etc.

The reference voltage ($V_{REF}=V_{REFP}-V_{REFM}$) switching circuit is generally represented by the numeral 102 and comprises reference capacitors 132a and 132b, and switches 112, 114 and 116. The remainder of the specific exemplary embodiment comprises voltage input capacitors 130a and 130b, switches 104, 106, 108 and 110, and differential operational amplifier 150 having feed-back sampling capacitors 134a and 134b. The output of the reference voltage switching circuit 102 is coupled with a summing point of the input sampling circuit. Hence, FIG. 2 shows the DAC in combination with parts of the feedback loop 10 of a sigma-delta analog-to-digital converter. However, other applications of such a DAC are possible and the present disclosure is not limited to sigma-delta ADCs.

$V_{REFP}$ and $V_{REFM}$ represent voltages at the differential reference input terminals. The reference voltage $V_{REF}=V_{REFP}-V_{REFM}$. $V_{INP}$ and $V_{INM}$ represent voltages at the differential input signal terminals. The input signal voltage $V_{IN}=V_{INP}-V_{INM}$. The reference capacitors 132a and 132b may be equal to C. The input sampling capacitors 130a and 130b may be equal to A*C. The feed-back capacitors 134a and 134b may be equal to C. Of course other values may apply depending on the design of the sigma-delta ADC. The input voltage is: $V_{IN}=V_{INP}-V_{INM}$, and the output voltage is: $V_{OUT}=V_{OUTP}-V_{OUTM}$. The gain of the circuit shown is A.

Referring to FIGS. 3a-3e, depicted are timing diagrams for conventional switching patterns of the switches 104-116 used to obtain the five equally distributed charge levels $2C^*V_{REF}$, $C^*V_{REF}$, 0, $-C^*V_{REF}$ and $-2C^*V_{REF}$ of the specific exemplary embodiment illustrated in FIG. 2. A "1" logic level depicts the respective switches in the closed position and a "0" logic level depicts the respective switches in the open position. FIGS. 3a-3e further illustrate the non-overlapping delays between the switches 104-116 in order to prevent a short between inputs and to ensure that the switches connected to the summing node always open first. The switches 104-116 are all open (off—logic 0) between time 202 and time 204. Time 202 signifies the end of the charging phase for both the reference capacitors 132 and input signal capacitors 130. Time 204 signifies the beginning of the transfer phase from both the reference capacitors 132 and input signal capacitors 130 to the feedback capacitors 134.

Referring to FIG. 3a, depicted is the timing diagram for transferring a plus (positive) charge, $2C^*V_{REF}$. The reference capacitors 132a and 132b are connected to $V_{REFP}$ and $V_{REFM}$, respectively, during the precharge phase (before time 202a) and switched to $V_{REFM}$ and $V_{REFP}$, respectively, during the transfer phase (after time 204a). The charge transferred is equal to $C^*(V_{REFP}-V_{REFM})-C^*(V_{REFM}-V_{REFP})=2C^*V_{REF}$. When summed with the voltage input sample charge, $A^*C^*(V_{INP}-V_{INM})-A^*C^*(V_{INM}-V_{INP})=2A^*C^*V_{IN}$ at the summing node of the input of the differential operational amplifier 150, the transferred voltage is $A^*V_{IN}+V_{REF}$ at the output of the differential operational amplifier 150.

Figure 3E:
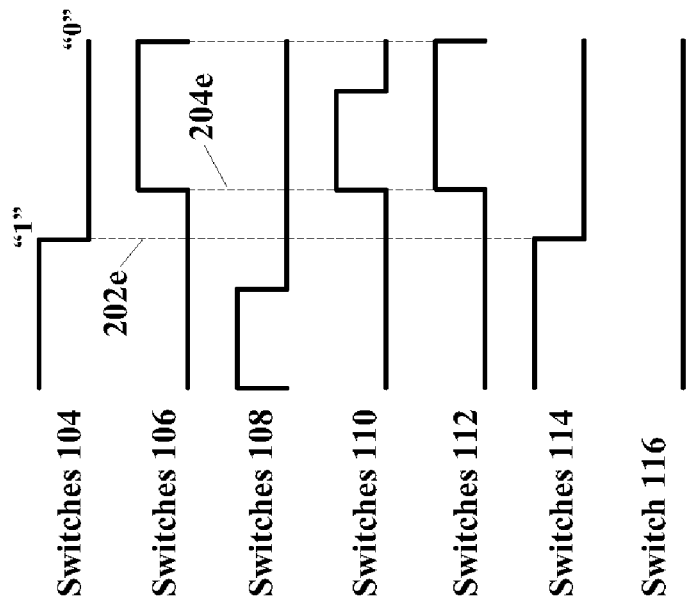

Referring to FIG. 3e, depicted is the timing diagram for transferring a minus (negative) charge, $2C^*(-V_{REF})$. The opposite pattern from that shown in FIG. 3a is performed to achieve a $-2C^*V_{REF}$ charge to the summing node. When summed with the voltage input sample charge, $A^*C^*(V_{INP}-V_{INM})-A^*C^*(V_{INM}-V_{INP})=2A^*C^*V_{IN}$ at the summing node of the input of the differential operational amplifier 150, the transferred voltage is $A^*V_{IN}-V_{REF}$ at the output of the differential operational amplifier 150. The charging and transferring patterns of FIGS. 3a and 3e represent a basic two level feed-back DAC of a sigma-delta modulator.

Three more charge levels are added to the basic operation of the aforementioned two-level feed-back DAC in order to achieve a five-level DAC. These three additional charge levels are $C^*V_{REF}$, 0 and $-C^*V_{REF}$.

Referring to FIG. 3b, in order to achieve a $C^*V_{REF}$ charge transfer, the reference capacitors 132a and 132b are connected to $V_{REFP}$ and $V_{REFM}$, respectively, during the precharge phase (before time 202b) and have their input plates short-circuited during the transfer phase (after time 204b). The charge transferred is then equal to $C^*(V_{REFP}-V_{REFM})-0=C^*V_{REF}$. When summed with the voltage input sample charge, $A^*C^*(V_{INP}-V_{INM})-A^*C^*(V_{INM}-V_{INP})=2A^*C^*V_{IN}$ at the summing node of the input of the differential operational amplifier 150, the transferred voltage is $A^*V_{IN}+V_{REF}/2$ at the output of the differential operational amplifier 150.

Referring to FIG. 3c, in order to achieve a zero charge transfer, the input plates of the reference capacitors 132a and 132b are short-circuited during both during the precharge phase (before time 202c) and the transfer phase (after time 204c). When summed with the voltage input sample charge, $A^*C^*(V_{INP}-V_{INM})-A^*C^*(V_{INM}-V_{INP})=2A^*C^*V_{IN}$ at the summing node of the input of the differential operational amplifier 150, the transferred voltage is $A^*V_{IN}+0$ at the output of the differential operational amplifier 150.

Figure 3D:
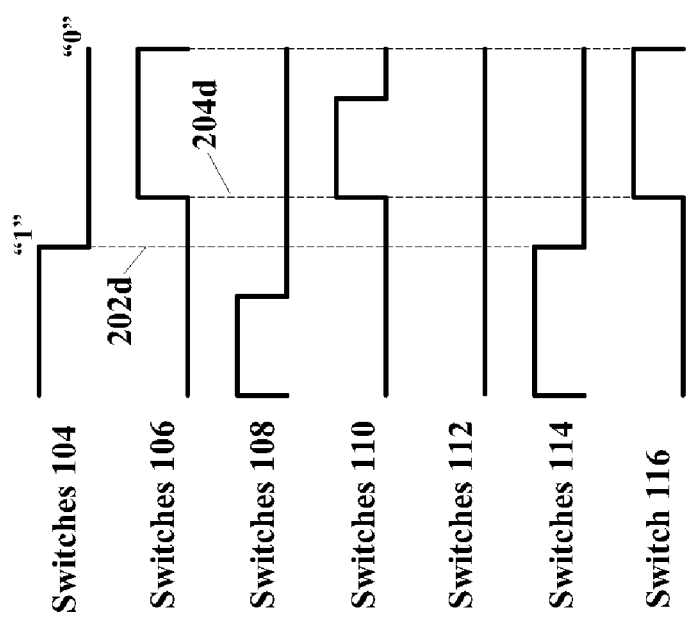

Referring to FIG. 3d, In order to achieve a $-C^*V_{REF}$ charge transfer, the reference capacitors 132a and 132b are connected to $V_{REFM}$ and $V_{REFP}$, respectively, during the precharge phase (before time 202d) and have their input plates short-circuited during the transfer phase (after time 204d). The charge transferred is then equal to $C^*(V_{REFM}-V_{REFP})-0=-C^*V_{REF}$. When summed with the voltage input sample charge, $A^*C^*(V_{INP}-V_{INM})-A^*C^*(V_{INM}-V_{INP})=2A^*C^*V_{IN}$ at the summing node of the input of the differential operational amplifier 150, the transferred voltage is $A^*V_{IN}-V_{REF}/2$ at the output of the differential operational amplifier 150.

The conventional different switching sequences as shown in FIGS. 3a-e produce good results with high precision assuming that the reference voltage does not have any offset. However, in reality the reference voltage Vref will have an offset Voffset that can and will negatively influence the performance of the digital-to-analog converter as will be explained in detail below. The switching technique for each pattern disclosed herein, according to various embodiments, uses a minimal amount of additional circuitry, and does not require significantly greater power consumption, while keeping standard switch phases of the switched capacitor sigma-delta ADC.

What is taught in this disclosure is usable for all multi-bit DACs, for example in all multi-bit Sigma-Delta ADC but is not limited to ADC. This improvement in resolution permits very low power consumption while achieving higher signal-to-noise ratio (SNR) and lower 1/f noise then current technology while keeping very good linearity performance. The added circuitry and power consumption is negligible, the chopper voltage reference does not need to be modified, thus enabling multi-channel systems to share the same voltage reference. The technique taught in this disclosure is also compatible with any modulator order.

According to various embodiments, it is possible to combine a conventional multi-bit DAC with a voltage reference that is using a Chopper algorithm and provide at the same time for a DAC that is inherently linear and for a removal of offset and 1/f noise induced by the reference circuit. Moreover as mentioned above, there is no need to modify the voltage reference circuit. This combination is more powerful than a bit stream controlled reference signal because it cancels the offset of the voltage reference at each stage as will be explained below.

Basically, the principle switching pattern to generate an output voltage of the 5-level DAC as shown in FIG. 2 is the following: A sampling cap 132a, 132b is precharged during the charge phase at either 0, +Vref or −Vref depending on the DAC input and on the next phase transfer phase, the charge applied takes a second value also either 0, +Vref or −Vref which gives a total charge transferred of:

$$(E_1-E_2)Vref^*C$$

where $E_2$=0, 1, −1 after the transfer phase $P_2$,
and $E_1$=0, 1, −1 after the precharge phase $P_1$.

Thus, depending on the switching sequence there are 9 possibilities of charge-transfer with such a DAC, but only 5 levels are reached by the total charge transferred. Here are all the possibilities:

TABLE 1

| # | P1 | P2 | DAC Input | Total Charge (SQ) |
|---|----|----|-----------|-------------------|
| 1 | +Vref | −Vref | +2 | +2Vref* C |
| 2 | +Vref | 0 | +1 | +Vref* C |

TABLE 1-continued

| # | P1 | P2 | DAC Input | Total Charge (SQ) |
|---|----|----|-----------|-------------------|
| 3 | 0 | −Vref | +1 | +Vref* C |
| 4 | +Vref | +Vref | 0 | 0 |
| 5 | 0 | 0 | 0 | 0 |
| 6 | −Vref | −Vref | 0 | 0 |
| 7 | 0 | +Vref | −1 | −Vref* C |
| 8 | −Vref | 0 | −1 | −Vref* C |
| 9 | −Vref | +Vref | −2 | −2Vref* C |

This table shows that the only possible total charge transferred levels are: +2Vref*C, +Vref*C, 0, −Vref*C and −2Vref*C. This table assumes that Vref is stable and this shows that there are two possibilities for transferring +Vref*C, or −Vref*C, 3 possibilities for transferring 0, and only one for +2Vref*C or −2Vref*C. Conventional DACs, thus, merely select 5 suitable patterns to produce five distinct output voltages and use only those for operating the DAC.

According to various embodiments, a different approach is used. An algorithm can be combined with a chopped reference voltage Vref, especially if the chopping algorithm is synchronous with phase P1 and P2 of a pattern, when toggling happens between P1 and P2. Phases P1 and P2 are the precharge phase and the transfer phase of a pattern, respectively. If the reference voltage is chopped, a real voltage reference is assumed to produce an effective voltage reference Vrefeff=Vref+Voffset during P1 and Vrefeff=Vref−Voffset during P2 (the chopper switching is done between P1 and P2). This modifies the table of charge transfers as follows:

TABLE 2

| # | P1 (Vref + Voffset) | P2 (Vref − Voffset) | DAC Input | Total Charge (SQ) |
|---|---------------------|---------------------|-----------|-------------------|
| 1 | +Vref + Voffset | −Vref + Voffset | +2 | (+2Vref) * C |
| 2 | +Vref + Voffset | 0 | +1 | (+Vref + Voffset) * C |
| 3 | 0 | −Vref + Voffset | +1 | (+Vref − Voffset) * C |
| 4 | +Vref + Voffset | +Vref − Voffset | 0 | (+2Voffset) * C |
| 5 | 0 | 0 | 0 | 0 |
| 6 | −Vref − Voffset | −Vref + Voffset | 0 | (−2Voffset) * C |
| 7 | 0 | +Vref − Voffset | −1 | (−Vref + Voffset) * C |
| 8 | −Vref − Voffset | 0 | −1 | (−Vref − Voffset) * C |
| 9 | −Vref − Voffset | +Vref − Voffset | −2 | (−2Vref) * C |

As can be seen, in the chopping Vref case, the total output charge differs but not for all combinations. For combinations #4 and #6 each phase generates an offset which is not cancelled out. However, these sequences do not need to be used because combination #5 generates a 0 charge with no offset influence. Similarly, for all even number of Vref transferred (even DAC inputs: #1 and #9), the offset is not propagated through, so this pattern cancels the offset for these cases. For the single Vref transfers though, the offset is transferred (#2, #3, #7 and #8 of Table 2) along with the voltage reference (add DAC inputs).

According to various embodiments, two techniques can be applied to cancel out the transferred offset: rotating capacitors/switching table lines alternatively for single transfers, or splitting the caps and apply two different patterns at the same time, and try to cancel the offset transferred. Lines 2 and 3 and lines 7 and 8 in Table 2 are transferring the same Vref*C charge and an opposite offset, namely ±Voffset*C charge. By combining 2 and 3 for a positive transfer and 7 and 8 for a negative transfer, offset cancellation can be achieved after each pair of transfers while transferring the right amount of Vref*C charge.

FIGS. 4a and 4b show the patterns which can be used to generate a transfer with +Vref/2 using the circuit as shown in FIG. 2. The difference between the patterns in FIGS. 4a and 4b is that pattern A generates a positive offset+Voffset/2 whereas pattern B generates a negative offset−Voffset/2. Similarly, patterns A and B as shown in FIGS. 5a and 5b are used to generate a transfer with −Vref/2 using the circuit as shown in FIG. 2. Again, pattern A in FIG. 5a generates a positive offset+Voffset/2 whereas pattern B in FIG. 5b generates a negative offset−Voff/2. The following examples show how these patterns can be combined to eliminate an offset efficiently.

FIG. 4a uses the same pattern as shown in FIG. 3b, thus, generating an output voltage of C/2C*(V_{REF}+Voffset)= (V_{REF}+Voffset)/2. However, referring to FIG. 4b, the reference capacitors 132a and 132b are connected to V_{REFP} and V_{REFM}, respectively, during the transfer phase (after time 204b) and have their input plates short-circuited during the precharge phase (before time 202b). The charge transferred is then equal to C*(V_{REF}−Voffset) and the output voltage becomes (V_{REF}−Voffset)/2.

FIG. 5a uses the same pattern as shown in FIG. 3d, thus, generating an output voltage of −C/2C*(V_{REF}+Voffset)=(−V_{REF}−Voffset)/2. However, referring to FIG. 5b, the reference capacitors 132a and 132b are connected to V_{REFM} and V_{REFP}, respectively, during the transfer phase (after time 204d) and have their input plates short-circuited during the precharge phase (before time 202d). The charge transferred is then equal to −C*(V_{REF}−Voffset) and the output voltage becomes (−V_{REF}+Voffset)/2.

Figure 6:
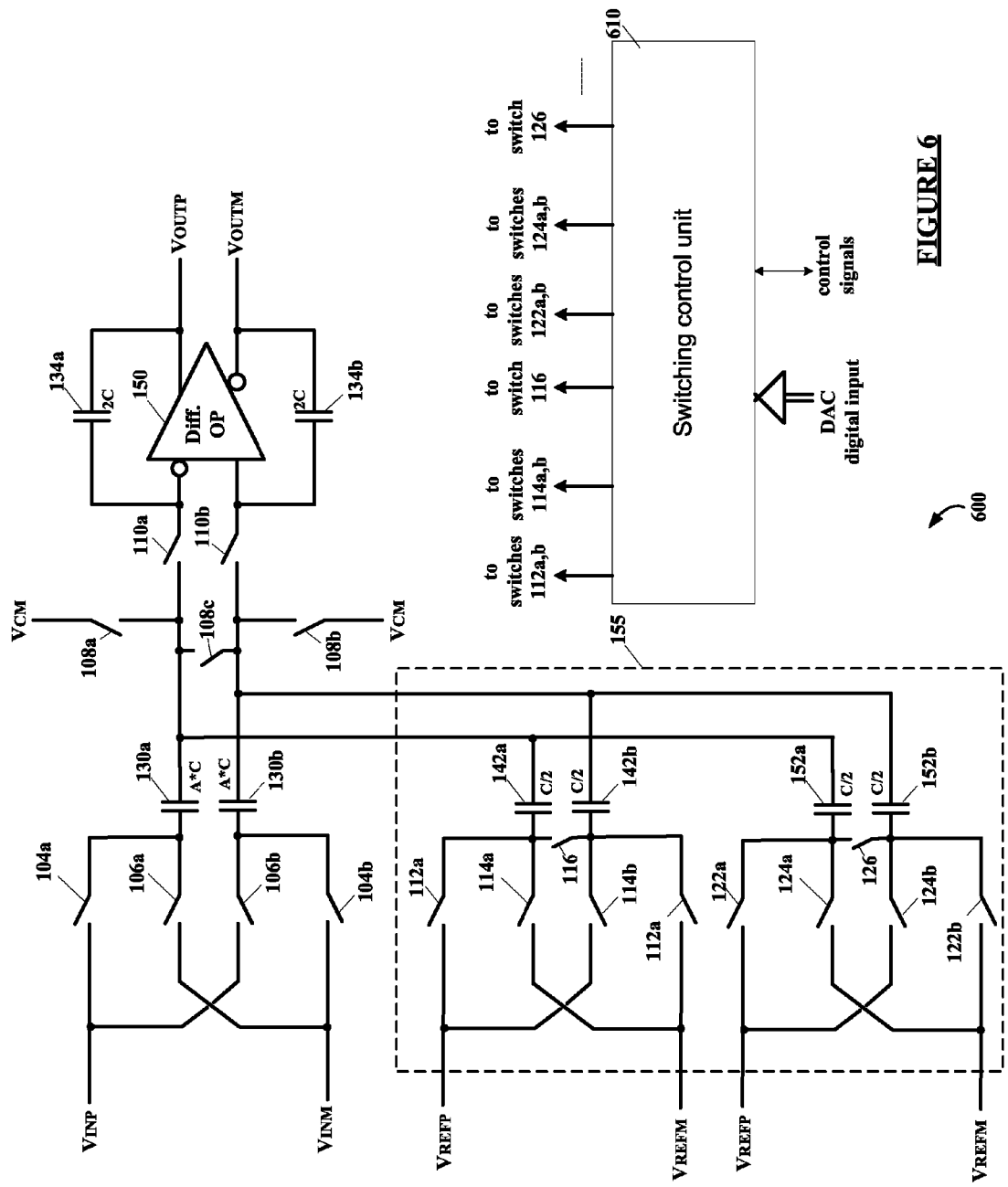
FIG. 6 shows another embodiment of a five level digital-to-analog converter using a chopper voltage reference for a switched capacitor sigma-delta analog to digital converter.

According to a first embodiment as for example shown in FIG. 6, each capacitor 132a and 132b is split into two capacitors 142a and 152a; and 142b and 152b, respectively. In this particular embodiment, as shown in FIG. 2, the capacitors used in circuit 102 all have the value C. Hence, as shown in FIG. 6, splitting will result in a value of C/2 for each capacitor 142, 142b, 152a, and 152b. Each capacitance of half the value (C/2) will be switched with a different switching pattern A or B as shown in FIGS. 4a, b and FIGS. 5 a, b, as discussed above, in order to cancel the offset dependent remainder charge when the input of DAC is equal 1 or −1. For the input values 0, 2, and −2, the same switching patterns as shown in FIGS. 3a, 3c, and 3e apply to both switching circuits. Hence, in case of an input of 0, 2, or −2, the switches 112 and 122 are controlled by the same control signals. Similarly, switches 116 and 126 as well as 114 and 124 are also controlled by the same signals in this case.

In this particular embodiment, the DAC capacitors are chosen to have a value of C/2. In other embodiments, these capacitors may have other nominal values. The entire switching circuit for the reference voltage is shown with numeral 150 in FIG. 7. Again a similar control circuit 610 as shown in FIG. 2 provides for the actual control signals for all switches. Again, only the control signals for the reference voltage switching circuit 155 are shown in FIG. 6. As can be seen, in the reference voltage switching circuit 155, capacitors 132a,b have been replaced by capacitors 142a,b and a second circuit for additional capacitors 152a,b with switches 122a,b, 124a,b and 126 has been added. Thus, two separate voltage reference switching circuits a arranged within switching circuit 155.

The switching patterns for the upper and lower reference switching circuits will follow lines 2 and 3 for a +Vref*C transfer and lines 7 and 8 for a −Vref*C transfer and are shown in FIGS. 4a, b and FIGS. 5a, b. As mentioned above, for all other output voltages the patterns shown in FIGS. 3a, 3c, and 3e are used.

The following Table 3 can be written for these transfers:

TABLE 3a

| | $P_1$ (Vref + Voffset) | P2 (Vref − Voffset) | Total charge (SQ) |
|---|---|---|---|
| $C_1$(142a, 142b): | +Vref + Voffset | 0 | (+Vref + Voffset) * $C_1$ = $SQ_1$ |
| $C_2$(152a, 152b): | 0 | −Vref + Voffset | (+Vref − Voffset) * $C_2$ = $SQ_2$ |
| | | | $SQ_1 + SQ_2 = SQ_{Total} =$ Vref($C_1 + C_2$) + Voffset($C_1 − C_2$) |

As mentioned above, instead of a single capacitor C, the capacitor is split into two. When $C_1=C_2=C/2$, the total charge transferred is +Vref*C, so the offset cancellation is effective for this single Vref*C transfer. The same table can be written for a −Vref*C transfer:

TABLE 3b

| | $P_1$ (Vref + Voffset) | P2 (Vref − Voffset) | Total charge (SQ) |
|---|---|---|---|
| $C_1$(142a, 142b): | −Vref − Voffset | 0 | (−Vref − Voffset) * $C_1$ = $SQ_1$ |
| $C_2$(152a, 152b): | 0 | +Vref − Voffset | (−Vref + Voffset) * $C_2$ = $SQ_2$ |
| | | | $SQ_{Total} = -\text{Vref}(C_1 + C_2) -$ Voffset($C_1 − C_2$) |

Again, when $$C_1 = C_2 = \frac{C}{2},$$

the total charge transferred is Vref*C, so the offset cancellation is also realized. Obtaining exactly $$C_1 = C_2 = \frac{C}{2}$$

is not possible with analog components so in reality, the offset component on both +Vref*C and −Vref*C transfers is not completely cancelled by splitting caps and combining algorithms. However, the offset can be clearly reduced by this measure and, thus, the performance is improved.

The value of the remainder is equal to $\pm(C_1-C_2)$ Voffset=$S_{error}$. The charge transferred is SQ=±Vref*C± error where C=$C_1$+$C_2$. This error is however relatively small:

$$\frac{S_{error}}{\text{Vref} \times C} = \frac{C_1 - C_2}{C_1 + C_2} \times \frac{\text{Voffset}}{\text{Vref}}.$$

Typically, the matching of capacitors in an analog process can be evaluated to 0.1% so the ratio:

$$\frac{C_1 - C_2}{C_1 + C_2} \simeq 0,1\%.$$

The Voffset is typically also about 0, 1% referred to Vref. So the ratio $$\frac{S_{error}}{\text{Vref} \times C}$$

is in the order of magnitude of $$1 \text{ ppm} = \frac{1}{10^6}.$$

The other applicable technique, according to various embodiments can cancel the charge transferred proportional to the offset but needs an even number of transfers cycles to do so. This technique is not subject to a matching of capacitors as the same capacitor is used for two different patterns. By switching alternatively between the patterns of lines 2 and 3 for a +Vref*C transfer and 7 and 8 for a −Vref*C transfer we can rewrite the table as shown below in Table 4:

TABLE 4

| | P1<br>(Vref + Voffset) | P2<br>(Vref − Voffset) | Total charge |
|---|---|---|---|
| | | a | |
| Transfer 1: | +Vref + Voffset | 0 | (Vref + Voffset) * C = $SQ_1$ |
| Transfer 2: | 0 | −Vref + Voffset | (Vref − Voffset) * C = $SQ_2$ |
| | | | $SQ_{total} = SQ_1 + SQ_2 = +2Vref * C$ |
| | | b | |
| Transfer 1: | 0 | +Vref − Voffset | (−Vref + Voffset) * C = $SQ_1$ |
| Transfer 2: | −Vref − Voffset | 0 | (−Vref − Voffset) * C = $SQ_2$ |
| | | | $SQ_{total} = SQ_1 + SQ_2 = -2Vref * C$ |

After two (or any even) number of samples, the Voffset contribution to the total charge transferred is cancelled in both cases. So if the total number of samples requiring a single Vref*C or Vref*C is even, a perfect offset cancellation is achieved. In case of an odd number, the total error induced by the offset contribution is ±Voffset*C, which is small if the total charge transferred is SQ=N*Vref*C, N being typically large if a large number of transfers is performed.

Figure 7A:
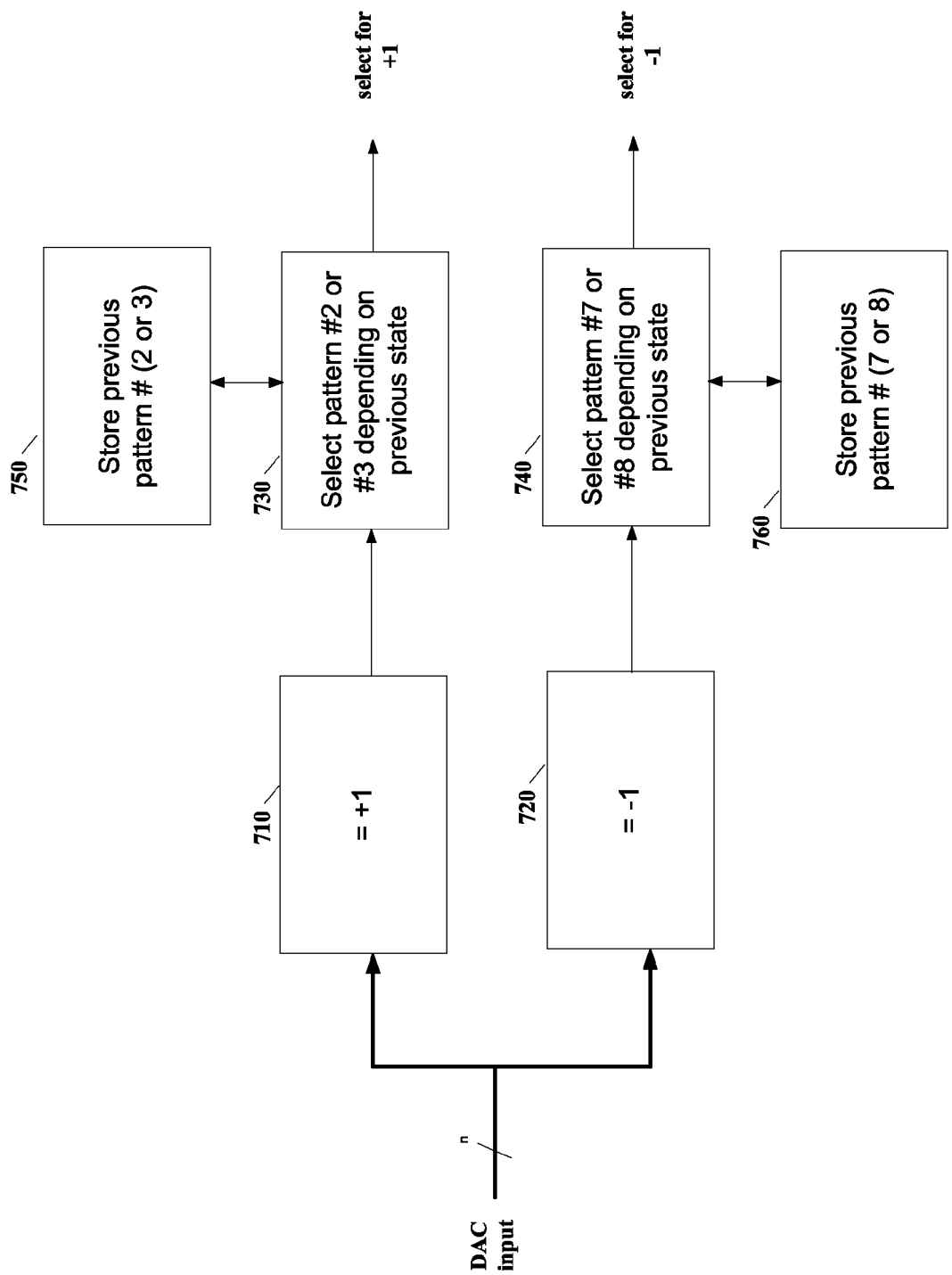
FIGS. 7A and B shows different embodiments in block diagrams for selection of the patterns shown in FIGS. 4a, b and FIGS. 5a, b, respectively.

FIG. 7A shows a first embodiment in block diagram of how the different switching patterns can be selected. The switching between the transfer algorithm lines can be done by simply detecting a +1 or −1 at the input of the DAC, for example by means of comparators 710, 720, and memorizing which state (which line) was effected on the last +1 (+Vref*C) or −1 (−Vref*C) transfer, for example, by registers or latches 750, 760, in order to choose the complimentary algorithm for the current transfers. Selection circuits 730, 740 use the inputs of comparators 710, 720 and registers 750, 760 to determine the current selected pattern. Alternatively, this can also be realized with two flip flops memorizing which algorithm has been performed on the last (+Vref*C) and (−Vref*C) transfer. These transfer flip flops will switch and toggle each time a single Vref*C transfer is performed so that the complimentary algorithm is chosen and so that the offset contribution is cancelled after two transfers for the next transfer of the same (+Vref*C) or (−Vref*C) charge. Both splitting and rotating techniques can also be combined for maximum offset contribution reduction if this reduction is evaluated at each sample. The average error of each sample is minimized through the parallel switching technique. This can also be implemented in a sample manner: Both caps $C_1$ and $C_2$ which are using line algorithms 2 and 3 or 7 and 8 would interleave their sequence so that every two transfers, the total charge would cancel the offset contribution. The splitting technique and the rotating technique can be considered to be the parallel and serial implementation of the same switching technique, respectively. By combining the parallel and serial switching technique, the serial switching will also only have to compensate for a much smaller offset determined by the difference in the split capacitors. The technique has been explained with a differential configuration shown in FIG. 6. However, the principles can be applied also to pseudo differential (single-ended) configurations.

Figure 7B:
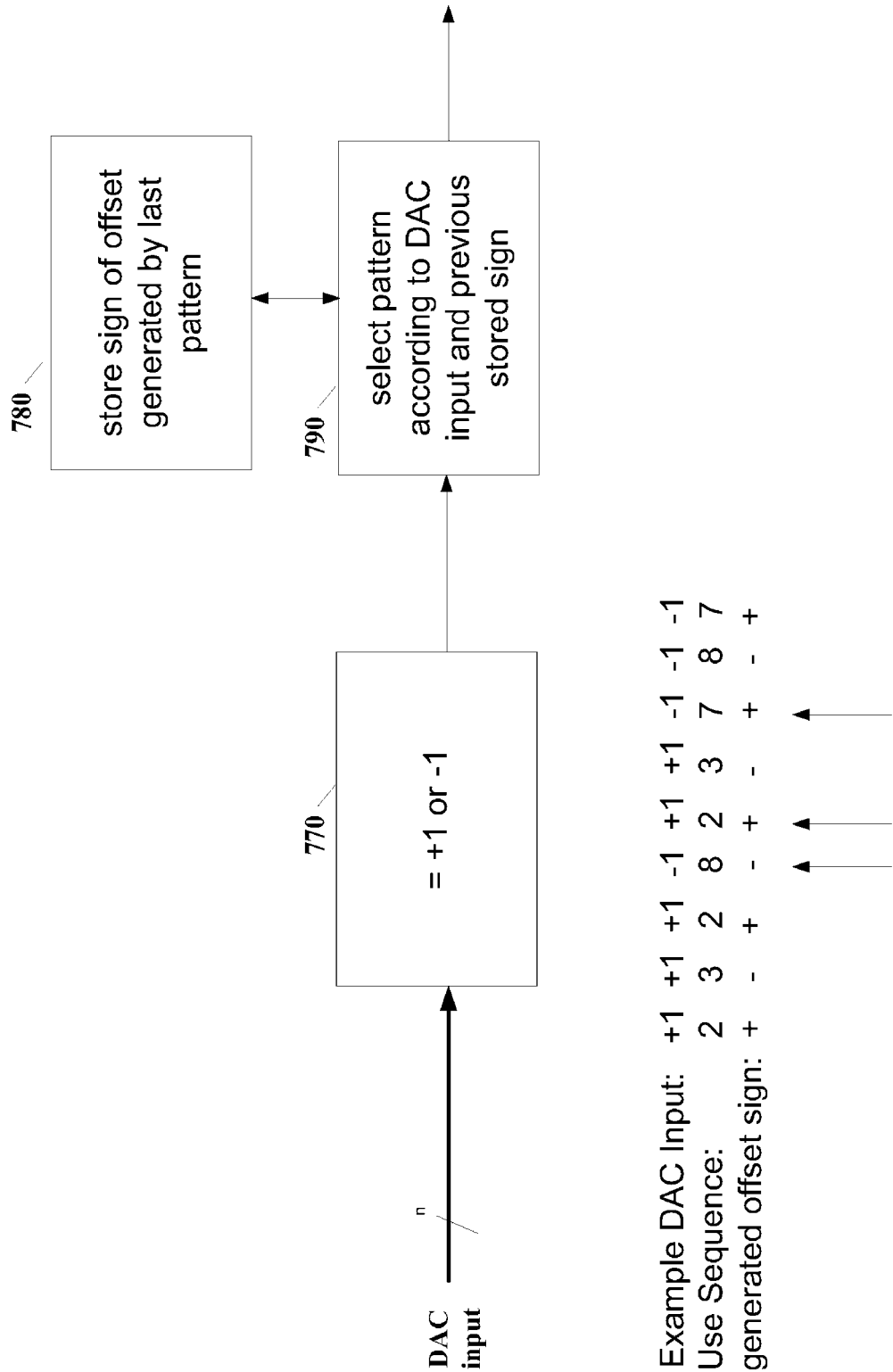

FIG. 7B shows an improved embodiment for selecting the appropriate switching patterns. Here, in block 770 is detected whether the input for the DAC is either +1 or −1 for selection of either patterns 2/3 or patterns 7/8. Thus, in block 790 either switching patterns 2/3 or switching patterns 7/8 are chosen depending on this DAC input value. A simplified procedure that produces further accuracy than the embodiment shown in FIG. 7A is then applied. When a selected pattern is 2 or 7 it is known that the generated offset will be positive whereas if the pattern is 3 or 8, the offset will be negative. Now instead of memorizing which pattern has been used, only a single memory cell is necessary that will store the sign of the generated offset. With this information the system will then just generate the opposite offset at the next sample to properly cancel the previous offset every two samples no matter what pattern was used in the previous sequence. It will, thus, be appreciated that this method is independent from the used pattern sequence, in particular when switching from one pattern sequence to another one. FIG. 7B shows a sample DAC input sequence and associated pattern sequence. The first three DAC inputs are +1, therefore the system uses alternately pattern 2 and 3. Moreover, the third line shows the offset that will be generated by a respective pattern. A switch between patterns 2/3 and 7/8 is indicated by arrows. This offset can be positive or negative and it will be stored in block 780. Only a single bit is necessary to do this. Block 790, thus, selects the appropriate pattern depending on the actual DAC input and the previously stored offset sign.

For example, if a DAC bitstream is: +1 +1 +1 −1 +1 +1 +1 −1 then a pattern sequence would look as follows: 2-3-2-8-2-3-2-8. The control system according to FIG. 7A would however yield to: 2-3-2-7-3-2-3-8. This enhanced control technique according to FIG. 7B will cancel the offset every two samples no matter if they are −1s OR +1s whereas the technique described in FIG. 7 would cancel the offset if there is an even number of +1s AND −1s. The offset integrated for these two sequences are respectively:
Control system according to FIG. 7B: +1 0 +1 0 +1 0 +1 0
Control system according to FIG. 7A: +1 0 +1+2 +1+2 +1 0

FIG. 7A does not cancel the offset every two samples a mix of +1s and −1s occurs whereas the enhanced control according to FIG. 7B cancels the offset every two samples with any mixed bitstream sequence of +1/−1.

Figure 8:
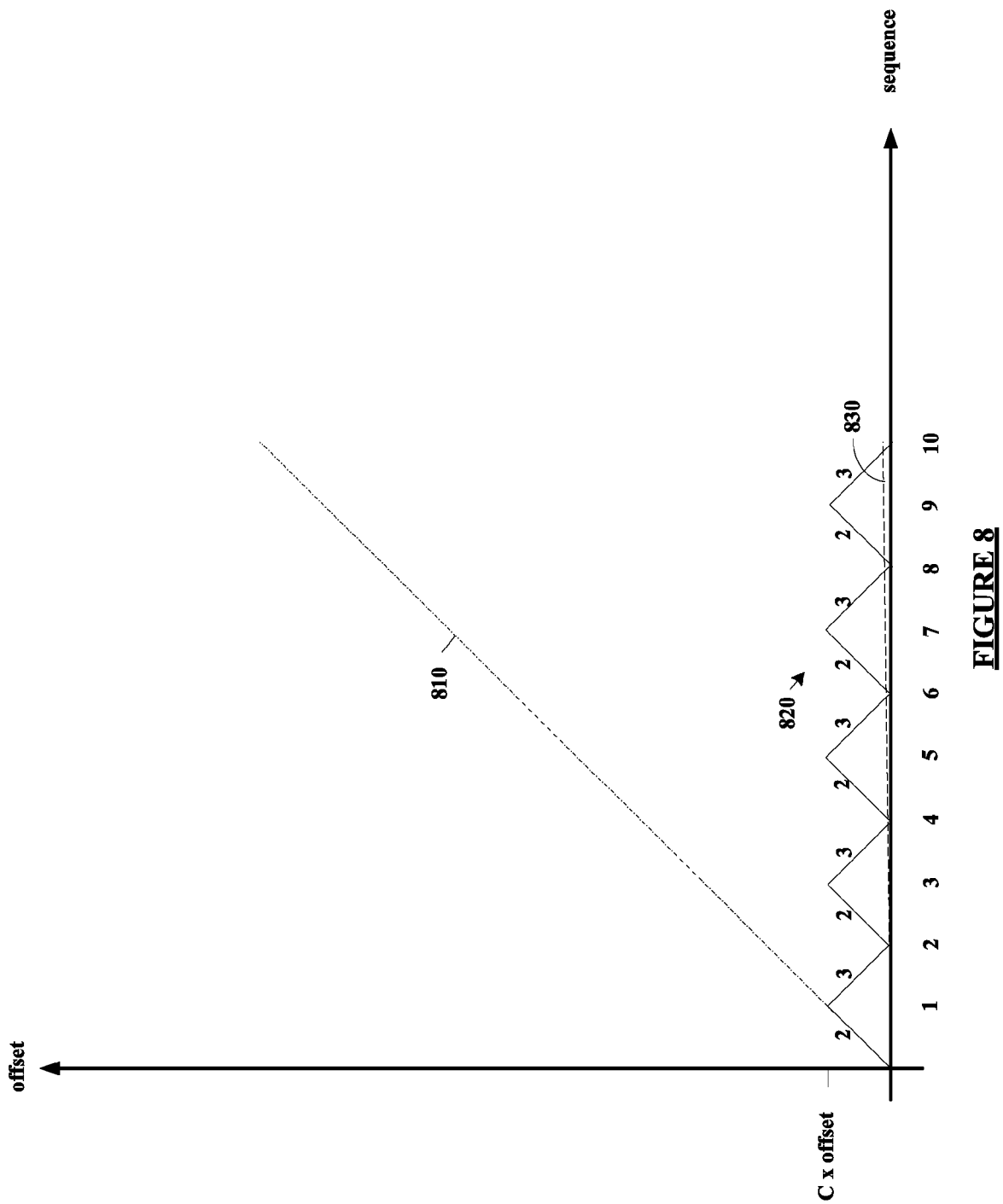
FIG. 8 shows offset contribution using a first switching algorithm.

FIG. 8 shows a graphical representations of the offset induced total charge contributions of different embodiments for a constant bit stream at +1 at the input of the DAC for 10 samples: Line 810 shows the rise of the offset when using the conventional switching techniques. Here each sample produces a C*offset contribution which can quickly rise to high values. Line 820 shows the effect of the serial switching technique when alternating patterns 2 and 3 are used to generate the +1 output value. Line 830 represents the error produced by the parallel switching technique using split capacitors. The offset induced charge is now proportional to SC=$|C_1-C_2|$ instead of C which gives much less average error since $$\frac{SC}{C} \sim 0,1\%$$

in standard analog CMOS processes for caps matched.

Thus this may be a preferred algorithm because it induces less offset at each sample. When used in a sigma-delta modulator which order is greater than one, the rotating algorithm meets a slight modification to perform perfect offset induced charge cancellation after multiple integrations in the modulator loop (number of integrations=order of modulator). For higher orders cancellation, a fractal sequencing scheme may be required and can be implemented with the simple sequences:

2 – 3

7 – 8 for the +1 or −1 DAC inputs.

Combined with the serial switching technique, a second order sequence would result in a 2-3-3-2-2-3-3 . . . sequence as the switching sequence scheme. The graphical representation of this technique is shown in FIG. 9 for 12 samples at DAC input=+1. As shown in the graph with line 910, the difference with the standard algorithm again rapidly increases whereas line 920 shows the average of a sequence using the serial switching technique is closer to zero, the second order average (area between plot and horizontal axis) is cancelled every 4 samples as taught in the fractal algorithm related U.S. Pat. No. 6,909,388 entitled "Fractal sequencing schemes for offset cancellation in sampled data acquisition systems" by Quiquempoix et al., and is incorporated by reference herein for all purposes.

FIG. 10 shows the effect of combining the parallel and serial switching techniques. The graph that follows shows the combination of splitting, rotating and fractal algorithm for 12 samples with DAC input=+1. As shown in the graph with line 1010, the difference with the standard algorithm again rapidly increases. Here line 1020 shows the effect of offset reduction. Note that each step produced by a parallel switching of split capacitors produces only an offset contribution of (C2−C1) *offset as opposed to the higher steps shown in FIG. 9. The switching patterns for split capacitors are also shown in FIG. 10 wherein each capacitor uses a complementary pattern.

FIGS. 8, 9, 10 are used to explain the general principles of eliminating or minimizing a reference voltage offset. However, it is to be understood that even though these figures show constant DAC input values of +1, the principles as explained in particular with respect to FIG. 7B can be applied to the pattern selection circuits. Thus, the selection method as described with respect to FIG. 7B can be executed no matter what the bitstream is (+1 or −1) provided that if it is −1, for example pattern 2 is replaced by 7 and pattern 3 by 8. Using the selection system of FIG. 7A could produce slowly increasing offsets depending on the structure of the incoming bitstream. The enhanced switching technique as explained in FIG. 7B, however, is furthermore better because the necessary circuit just requires one memory element instead of 2, and cancels the offset every two samples regardless of the bitstream (provided it is +1 or −1).

Figure 11A:
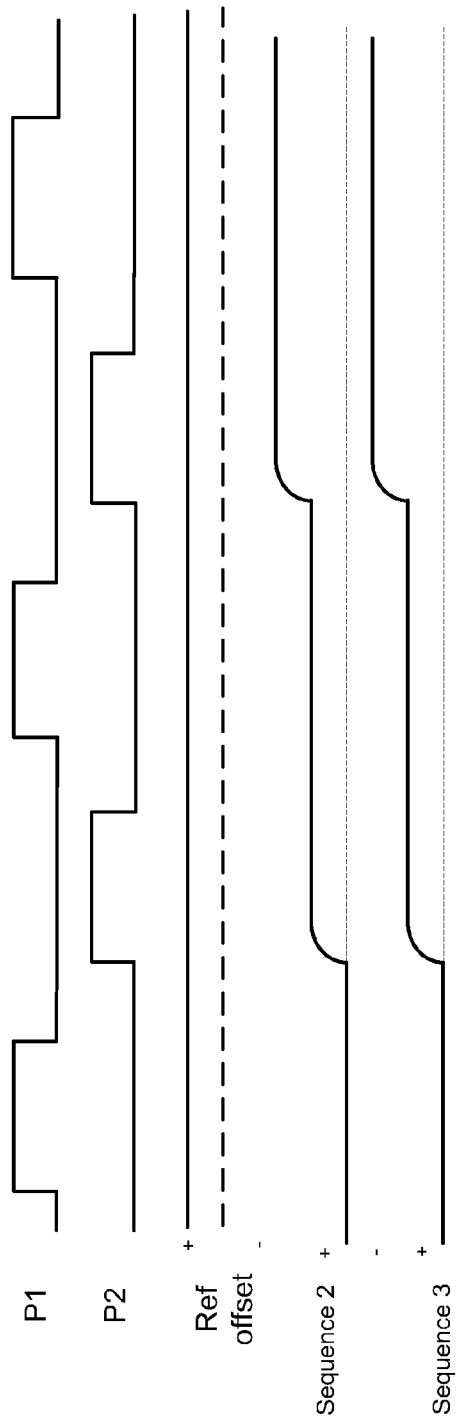

The following section will explain the general differences between conventional systems and various embodiments. To this end, various scenarios are shown in FIGS. 11A-D. First, FIG. 11A shows the effect of either sequence 2 or 3 if the reference voltage is not chopped and, for example, comprises a positive offset. No matter what sequence would be applied, the outcome would always add a positive offset to each charge-transfer phase. Hence, an increasing offset would be produced for sequence 2 or 3 as shown.

Figure 11B:
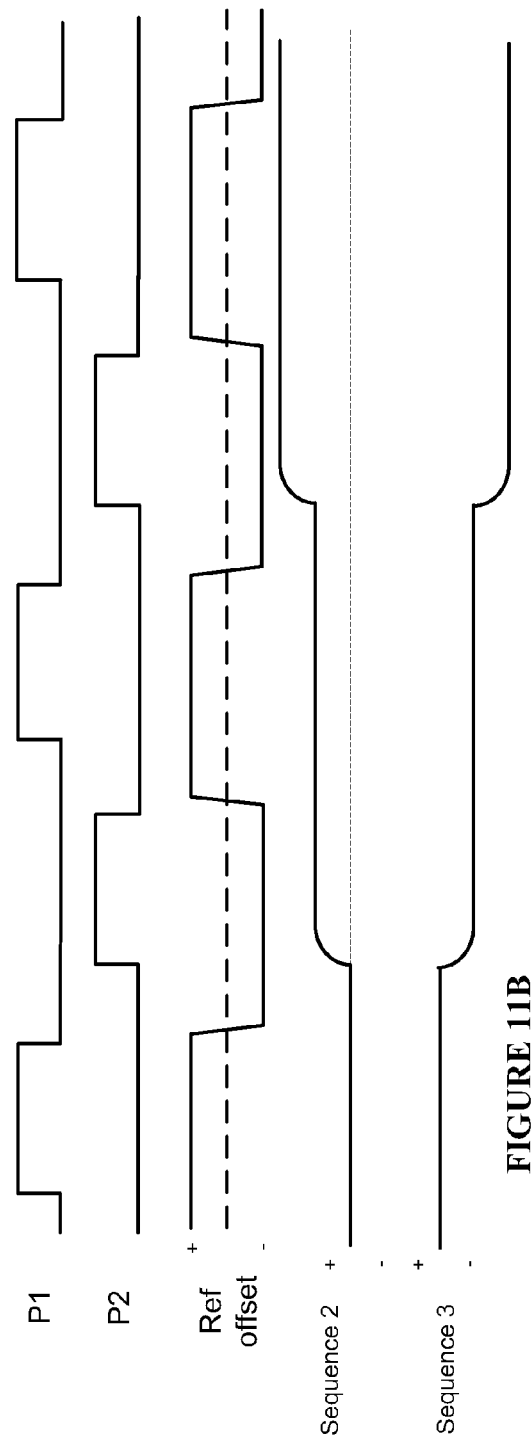
Figure 12:
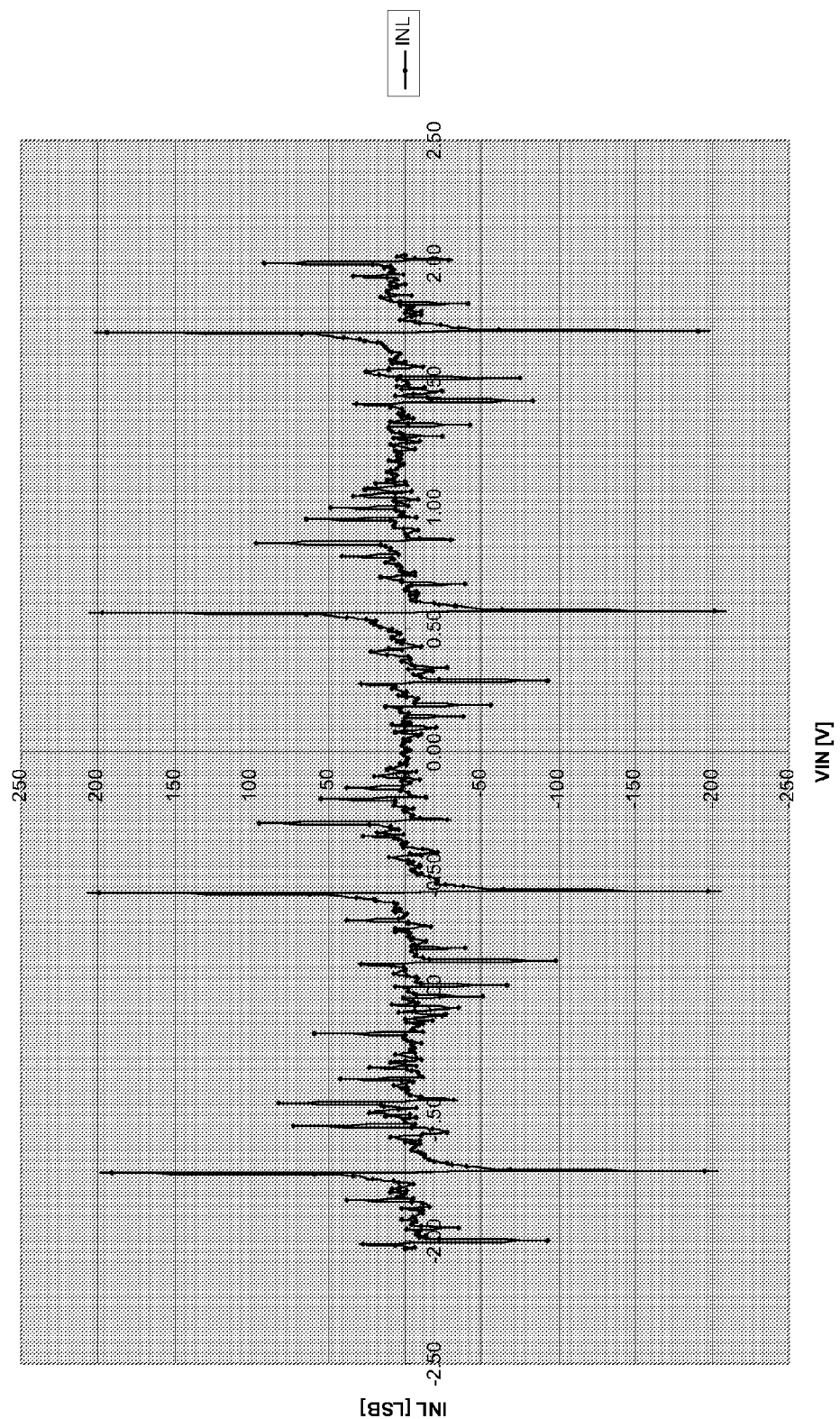
FIG. 12 shows the error of a conventional chopper controlled reference voltage.

FIG. 11B shows a chopper algorithm that toggles every phase between P1 and $$P2\begin{pmatrix} P1 & P2 & P1 & P2 & \ldots \\ + & - & + & - \end{pmatrix}.$$

Now, sequence 2 generates a positive offset contribution and sequence 3 generates a negative contribution. All embodiments described so far use this concept. For example, FIG. 11C shows the result of different sequence patterns. Using pattern 2-2-2-2 would result again in an increasing offset. However, sequence 2-3-2-3 and sequence 2-3-3-2 and any other suitable combination result in either no offset or a maximum of a single positive or negative offset contribution. In other words, these patterns basically circle around a zero offset.

This concept can however be extended to a slower chopper algorithm frequency by modulating the chopper frequency with the switching algorithm. In other words, the reference chopper frequency is different from the charge-transfer frequency. This can be useful because it enables to operate with slow frequency chopping which consumes less power. However, according to an embodiment, the most efficient and preferable frequency is two times slower than each phase (same period as the bit stream period). Normally, the switching of the chopper would be $$\begin{pmatrix} P1 & P2 & P1 & P2 & P1 & P2 & P1 & P2 & P1 \\ + & - & - & + & + & - & - & + & + \end{pmatrix}$$

However, as shown in FIG. 11D, now sequence 2 generates either a positive or a negative contribution due to the different phases P1 and P2. Thus, if the chopper frequency is half the charge-transfer frequency, the pattern has to be switched. Furthermore, it requires that the chopper switch is taking place only between P1 and P2. Here, the $2^{nd}$ order fractal sequence would be modified as follows:

Std chopper (toggles between each phase): 2-3-2-3 changed to 2-2-2-2

Note that the switching sequence 3 associated with chopping sequence $$\begin{pmatrix} P1 & P2 \\ + & - \end{pmatrix}$$

is equal to that of the switching sequence 2 associated with chopping sequence $$\begin{pmatrix} P1 & P2 \\ - & + \end{pmatrix}.$$

Therefore using the 2 times slower chopper (toggles only between end of P1 and beginning of P2) changes the above 2-3-3-2 sequence to the: 2-2-3-3 sequence.

The graphs showed were for constant bit streams for purpose of the demonstration, if the bit stream differs, the graph is valid if the x-axis is considered to represent only the number of samples with the same DAC input. Then, each different input will have its own graph, even imports will show flat, equal to zero graphs and odd imports will show straight waveforms.

The above descriptions apply to a 2 phases architecture that has the advantage of being fast since the signal and reference are processed in parallel into 2 separated networks. However this architecture suffers of mismatch error between the signal and reference network. This mismatch error induces a gain error. As mentioned above, the matching between capacitors in an analog process is in the range of 0.1% leading to an accuracy of 0.1% on the ADC gain. In some applications, such gain error cannot be tolerated. Therefore a mismatch independent architecture is required.

There are mainly two approaches for achieving mismatch independent structures: Rotating capacitors and using the same capacitor set for the signal and reference path. When the rotating cap solution is chosen, one memory set per rotating capacitor configuration is required in the DAC. The cost is thus a more complex structure. When using the same capacitor set for the signal and reference path is chosen, the signal and reference are processed sequentially. This leads to a 4 (or more) phases architecture. The cost is a longer conversion time.

Figure 13:
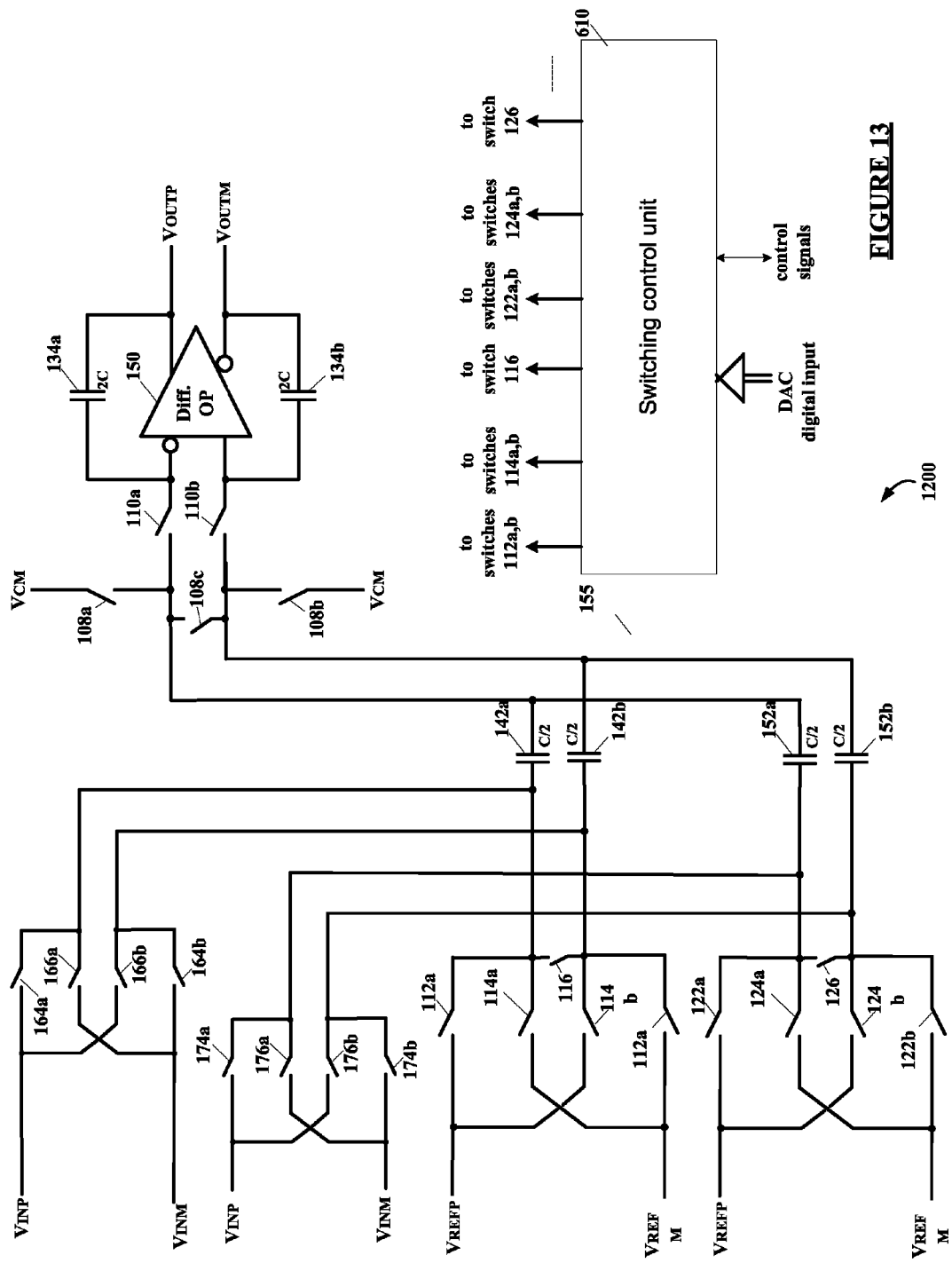
FIG. 13 shows another embodiment of a five level digital-to-analog converter.

FIG. 13 shows a possible implementation of a DAC solution (with the split reference capacitors) using the same capacitor set for the signal and reference architecture. FIG. 14 shows one possible switching sequence for achieving a gain error free Vin−Vref/2 transfer. Other equivalent switching sequences may be used.

It is known that sigma-delta modulators having a gain of 1 between the input and reference path are not stable over the full Vref range. The stability range may reach 98 or 99% of the Vref range for $1^{st}$ order modulators but decreases to 85% or less for $2^{nd}$ order modulators, 70% or less for $3^{rd}$ order modulators and further decreases when the modulator order is further increased. Therefore when a full Vref range is required for the input signal, it must be attenuated before being applied to the modulator.

Exact gain of ½ can easily be achieved with the proposed architecture of FIG. 13. Thus, according to the embodiment shown in FIG. 13 and shown in more detail in FIGS. 14 and 15, the DAC capacitors are used alternately as the signal capacitors for signal processing during a first charge/transfer sequence and then as the reference capacitors during a second charge/transfer sequence. FIGS. 14 and 15 clearly show the four phase operation in which first the charge and transfer of the analog input signal and then the charge and transfer of the reference value is performed. Other arrangements of these cycles can be designed according to different embodiments. The benefit of the gain of ½ in the analog section is that it can easily be compensated in the digital domain filter. FIG. 15 shows a possible switching sequence for achieving a gain error free Vin/2−Vref/2 transfer. FIG. 14 (respectively 15) give a possible switching sequence example for a gain error free Vin−Vref/2 transfer (respectively Vin/2−Vref/2 transfer). The switching sequences for achieving the other DAC levels can easily be derived from the above teachings. Assuming a gain of 2 in the digital domain filter, a very accurate A/D analog front end having a selectable gain of 2 and 1 can be achieved with the architecture shown in FIG. 13 by selecting sequences as shown for example in FIGS. 14 and 15, respectively.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. A multi-bit digital-to-analog converter comprising:
a chopped reference voltage generator generating a reference voltage that comprises a chopped offset voltage;
a switched capacitor stage for generating a plurality of output voltages;
a switching sequencer controlling said switched capacitor stage operable to generate switching patterns for each output voltages, wherein each pattern comprising a charge phase and a transfer phase, and wherein for at least one output voltage the switching sequencer provides two switching patterns wherein each switching pattern contributes an offset of opposite polarity.

2. The multi-bit digital-to-analog converter according to claim 1, wherein the switching sequencer comprises memory means to store the sign of a generated offset and the switching sequencer selects a pattern depending on an input value and said stored sign.

3. The multi-bit digital-to-analog converter according to claim 1, wherein the reference voltage generator is chopped with each charge and transfer phase and the two switching patterns are applied alternately to the switched capacitor stage.

4. The multi-bit digital-to-analog converter according to claim 1, wherein the reference voltage generator is chopped only between a charge and a transfer phase and either the first or second switching patterns is applied to the switched capacitor stage.

5. The multi-bit digital-to-analog converter according to claim 1, wherein the switched capacitor stage comprises two partial switching stages in parallel and the two switching patterns are applied to the first and second partial switching stages, respectively.

6. The multi-bit digital-to-analog converter according to claim 5, wherein the two switching patterns are applied alternately to the first and second partial switching stages.

7. The multi-bit digital-to-analog converter according to claim 1, wherein the switched capacitor stage comprises:
a plus reference voltage capacitor having a capacitance of C;
a minus reference voltage capacitor having a capacitance of C;
a first pair of switches adapted for switchably coupling the plus and minus reference voltage capacitors to plus and minus reference voltages, respectively;
a second pair of switches adapted for switchably coupling the plus and minus reference voltage capacitors to the minus and the plus reference voltages, respectively; and
a third switch adapted for switchably coupling the plus and minus reference voltage capacitors together.

8. The multi-bit digital-to-analog converter according to claim 7, wherein the multi-bit digital-to-analog converter is a 5-level (3-bit) digital-to-analog converter and wherein the first pair of switches, the second pair of switches, and the third switch are sequenced in a charge phase and a transfer phase to produce five equally distributed charge levels of 2C*V_REF, C*V_REF, 0, −C*V_REF and −2C*V_REF, wherein V_REF is a reference voltage.

9. The multi-bit digital-to-analog converter according to claim 8, wherein the charge phase and transfer phase switching sequences of the first pair of switches, the second pair of switches, and the third switch do not overlap.

10. The multi-bit digital-to-analog converter according to claim 8, wherein for the charge level of C*V_REF, in a first pattern:
the first pair of switches are closed during the charge phase and open during the transfer phase;
the second pair of switches are open during the charge phase and the transfer phase; and
the third switch is open during the charge phase and closed during the transfer phase;
and in a second pattern:
the first pair of switches are open during the charge phase and during the transfer phase;
the second pair of switches are open during the charge phase and closed during the transfer phase; and
the third switch is closed during the charge phase and open during the transfer phase.

11. The multi-bit digital-to-analog converter according to claim 8, wherein for the charge level of −C*V_REF, in a first pattern:
the first pair of switches are open during the charge phase and the transfer phase;
the second pair of switches are closed during the charge phase and open during the transfer phase; and
the third switch is open during the charge phase and closed during the transfer phase;
and in a second pattern:
the first pair of switches are open during the charge phase and closed during the transfer phase;
the second pair of switches are open during the charge phase and the transfer phase; and
the third switch is closed during the charge phase and open during the transfer phase.

12. The multi-bit digital-to-analog converter according to claim 1, wherein the switched capacitor stage comprises first and second reference voltage switching circuits, each comprising:
a plus reference voltage capacitor having a capacitance of C/2;
a minus reference voltage capacitor having a capacitance of C/2;
a first pair of switches adapted for switchably coupling the plus and minus reference voltage capacitors to plus and minus reference voltages, respectively;
a second pair of switches adapted for switchably coupling the plus and minus reference voltage capacitors to the minus and the plus reference voltages, respectively; and
a third switch adapted for switchably coupling the plus and minus reference voltage capacitors together, wherein the first pair of switches, the second pair of switches.

13. The multi-bit digital-to-analog converter according to claim 12, wherein the multi-bit digital-to-analog converter is a 5-level (3-bit) digital-to-analog converter and wherein the first pair of switches, the second pair of switches, and the third switch of each reference voltage switching circuit are sequenced in a charge phase and a transfer phase to produce five equally distributed charge levels of C*V_REF, C/2*V_REF, 0, −C/2*V_REF and −C*V_REF, wherein V_REF is a reference voltage.

14. The multi-bit digital-to-analog converter according to claim 13, wherein the charge phase and transfer phase switching sequences of the first pair of switches, the second pair of switches, and the third switch for each reference voltage switching circuit do not overlap.

15. The multi-bit digital-to-analog converter according to claim 13, wherein for the charge level of C/2*V_REF, for the first reference voltage switching circuit:
the first pair of switches are closed during the charge phase and open during the transfer phase;
the second pair of switches are open during the charge phase and the transfer phase; and
the third switch is open during the charge phase and closed during the transfer phase;
and for the second reference voltage switching circuit:
the first pair of switches are open during the charge phase and during the transfer phase;
the second pair of switches are open during the charge phase and closed during the transfer phase; and
the third switch is closed during the charge phase and open during the transfer phase;
or vice versa.

16. The multi-bit digital-to-analog converter according to claim 13, wherein for the charge level of −C/2*V_REF, for the first reference voltage switching circuit:
the first pair of switches are open during the charge phase and the transfer phase;
the second pair of switches are closed during the charge phase and open during the transfer phase; and
the third switch is open during the charge phase and closed during the transfer phase;
and for the second reference voltage switching circuit:
the first pair of switches are open during the charge phase and closed during the transfer phase;
the second pair of switches are open during the charge phase and the transfer phase; and
the third switch is closed during the charge phase and open during the transfer phase;
or vice versa.

17. A sigma-delta modulator comprising a multi-bit digital-to-analog converter according to claim 1, further comprising an analog input voltage stage with a capacitive feedback network coupled with said multi-bit digital-to-analog converter.

18. A method for producing at least one output voltage of a plurality of output voltages in a switched capacitor digital-to-analog converter, comprising the steps of:
receiving an input signal for the at least one output voltage;
providing a reference voltage using chopper control, thereby generating a positive or negative offset to said reference voltage,
generating said at least one output voltage with a first switching pattern A having a first and second phase, thereby generating a positive offset; and
generating said at least one output voltage with a second switching pattern B different from said first switching pattern for said first and second phase, thereby generating a negative offset.

19. The method according to claim 18, further comprising the steps of
storing the sign of a generated offset, and
selecting a pattern depending on the input signal and said stored sign.

20. The method according to claim 18, wherein said chopper control is chopping said reference voltage for each first and second phase.

21. The method according to claim 18, wherein said chopper control is chopping said reference voltage only between said first and second phase and using only pattern A or pattern B.

22. The method according to claim 20, wherein said first pattern and second pattern are used alternately for a sequence of said input signals with a control sequence of "ABAB AB . . . " or "BABABA . . . ".

23. The method according to claim 20, wherein said first pattern and second pattern are used alternately for a sequence of said input signals including a control sequence of "AABBAABB . . . " or "BBAABBAA . . . ".

24. The method according to claim 18, wherein five reference voltage levels are generated in a feed-back digital-to-analog converter, said method comprising the steps of:
providing a plus reference voltage capacitor having a capacitance of C;
providing a minus reference voltage capacitor having a capacitance of C;
producing a charge level of C*$V_{REF}$ by
coupling the plus and minus reference voltage capacitors to the plus and minus reference voltages, respectively, during the charge phase, and
coupling the plus and minus reference voltage capacitors together, during the transfer phase;
or by
coupling the plus and minus reference voltage capacitors together, during the charge phase; and
coupling the plus and minus reference voltage capacitors to the minus and plus reference voltages, respectively, during the transfer phase;
and
producing a charge level of −C*$V_{REF}$ by
coupling the plus and minus reference voltage capacitors to the minus and the plus reference voltages, respectively, during the charge phase; and
coupling the plus and minus reference voltage capacitors together, during the transfer phase;
or by
coupling the plus and minus reference voltage capacitors together, during the charge phase; and
coupling the plus and minus reference voltage capacitors to the plus and the minus reference voltages, respectively, during the transfer phase.

25. The method according to claim 24, further comprising the steps of:
providing a plus input voltage capacitor having a capacitance of A*C;
providing a minus input voltage capacitor having a capacitance of A*C;
coupling the plus and minus input voltage capacitors to plus and minus input voltages, respectively, during the charge phase;
coupling the plus and minus input voltage capacitors to the minus and plus input voltages, respectively, during the transfer phase;
coupling the plus and minus reference voltage capacitors and the plus and minus input voltage capacitors to a common mode voltage during the charge phase; and
coupling the plus and minus reference voltage capacitors and the plus and minus input voltage capacitors to a differential input of an amplifier during the transfer phase,
wherein the amplifier having a respective capacitive feedback network produces five equally distributed output voltages of A*$V_{IN}$+$V_{REF}$, A*$V_{IN}$+$V_{REF}$/2, A*$V_{IN}$+0, A*$V_{IN}$−$V_{REF}$/2 and A*$V_{IN}$−$V_{REF}$, where A is gain, $V_{IN}$ is the input voltage, and $V_{REF}$ is the reference voltage.

26. A method for producing at least one output voltage of a plurality of output voltages in a switched capacitor digital-to-analog converter, comprising the steps of:
receiving an input signal for the at least one output voltage;
providing a reference voltage using chopper control, thereby generating a positive or negative offset to said reference voltage,
generating a first partial charge with a first switching pattern A using a first and second phase, thereby generating a positive offset; and in parallel
generating a second partial charge with a second switching pattern B different from said first switching pattern using said first and second phase, thereby generating a negative offset;
adding said first and second partial charges to form said output voltage.

27. The method according to claim 26, further comprising the steps of
storing the sign of a resulting offset, and
selecting first and second patterns depending on the input signal and said stored sign.

28. The method according to claim 26, wherein the switching pattern for the first partial charge and the second partial charge are alternated for a sequence of said input signals, wherein an alternating control sequence comprises the patterns "ABABAB . . . " or "BABABA . . . ".

29. The method according to claim 26, wherein the switching pattern for the first partial charge and the second partial charge are alternated for a sequence of said input signals, wherein an alternating control sequence comprises the patterns "AABBAABB . . . " or "BBAABBAA . . . ".

30. The method according to claim 26, wherein five reference voltage levels are generated in a feed-back digital-to-analog converter, said method comprising the steps of:
providing a first plus reference voltage capacitor having a capacitance of C/2;
providing a first minus reference voltage capacitor having a capacitance of C/2;
providing a second plus reference voltage capacitor having a capacitance of C/2;
providing a second minus reference voltage capacitor having a capacitance of C/2;
producing a charge level of C*$V_{REF}$ by generating a first charge by:
coupling the first plus and minus reference voltage capacitors to the plus and minus reference voltages, respectively, during the charge phase, and
coupling the first plus and minus reference voltage capacitors together, during the transfer phase;
generating a second charge by:
coupling the second plus and minus reference voltage capacitors together, during the charge phase; and
coupling the second plus and minus reference voltage capacitors to the minus and plus reference voltages, respectively, during the transfer phase;
and adding said first and second charge;
and
producing a charge level of −C*$V_{REF}$ by
generating a first charge by:
coupling the first plus and minus reference voltage capacitors to the minus and the plus reference voltages, respectively, during the charge phase; and coupling the first plus and minus reference voltage capacitors together, during the transfer phase;

generating a second charge by:

coupling the second plus and minus reference voltage capacitors together, during the charge phase; and coupling the second plus and minus reference voltage capacitors to the plus and the minus reference voltages, respectively, during the transfer phase;

and adding said first and second charge.

31. The method according to claim 30, further comprising the steps of:

providing a plus input voltage capacitor having a capacitance of A*C;

providing a minus input voltage capacitor having a capacitance of A*C;

coupling the plus and minus input voltage capacitors to plus and minus input voltages, respectively, during the charge phase;

coupling the plus and minus input voltage capacitors to the minus and plus input voltages, respectively, during the transfer phase;

coupling the plus and minus reference voltage capacitors and the plus and minus input voltage capacitors to a common mode voltage during the charge phase; and coupling the plus and minus reference voltage capacitors and the plus and minus input voltage capacitors to a differential input of an amplifier during the transfer phase, wherein the amplifier having a respective capacitive feedback network produces five equally distributed output voltages of $A*V_{IN}+V_{REF}$, $A*V_{IN}+V_{REF}/2$, $A*V_{IN}+0$, $A*V_{IN}-V_{REF}/2$ and $A*V_{IN} V_{REF}$, where A is gain, $V_{IN}$ is the input voltage, and $V_{REF}$ is the reference voltage.

32. The method of claim 26, comprising the steps of using first and second capacitors alternately to generate a reference output voltage and to charge and transfer an analog input voltage.

33. The method according to claim 32, comprising the steps of:

providing first and second analog input circuits for directly coupling an analog input signal with first plus and minus reference voltage capacitors of a first partial reference circuit and second plus and minus reference voltage capacitors of a second partial reference circuit;

coupling the first and second plus and minus reference voltage capacitors with said analog input signal, respectively, during a first charge phase;

coupling the first and second plus and minus reference voltage capacitors with an inverted analog input signal, respectively, during a first transfer phase;

coupling the first plus and minus reference voltage capacitors with an inverted reference voltage while connecting said second plus and minus reference voltage capacitors during a second charge phase; and coupling the second plus and minus reference voltage capacitors with the reference voltage while connecting said first plus and minus reference voltage capacitors during a second transfer phase.

* * * * *